US011211686B2

(12) United States Patent
Ramasamy et al.

(10) Patent No.: US 11,211,686 B2
(45) Date of Patent: Dec. 28, 2021

(54) SYSTEM AND METHOD FOR OPERATION OF A HINGE CAVITY ANTENNA

(71) Applicant: Dell Products, LP, Round Rock, TX (US)

(72) Inventors: Suresh K. Ramasamy, Cedar Park, TX (US); Sumana Pallampati, Austin, TX (US); Changsoo Kim, Cedar Park, TX (US)

(73) Assignee: Dell Products, LP, Round Rock, TX (US)

( * ) Notice: Subject to any disclaimer, the term of this patent is extended or adjusted under 35 U.S.C. 154(b) by 66 days.

(21) Appl. No.: 16/706,025

(22) Filed: Dec. 6, 2019

(65) Prior Publication Data

US 2021/0175608 A1 Jun. 10, 2021

(51) Int. Cl.
*H01Q 1/00* (2006.01)
*H01Q 1/22* (2006.01)
*H05K 5/02* (2006.01)
*G06F 1/16* (2006.01)

(52) U.S. Cl.
CPC ......... *H01Q 1/2266* (2013.01); *G06F 1/1681* (2013.01); *H01Q 1/2283* (2013.01); *H05K 5/0226* (2013.01)

(58) Field of Classification Search
CPC .. G06F 1/1681; H01Q 1/2266; H01Q 1/2283; H05K 5/0226
See application file for complete search history.

(56) References Cited

U.S. PATENT DOCUMENTS

| | | | | |
|---|---|---|---|---|
| 2007/0139286 | A1* | 6/2007 | Navsariwala | H01Q 21/28 343/767 |
| 2014/0367136 | A1* | 12/2014 | Trojanowski | H02G 3/14 174/66 |
| 2015/0029650 | A1* | 1/2015 | Daley, III | G06F 1/1662 361/679.12 |
| 2018/0131091 | A1* | 5/2018 | Chang | H01Q 5/335 |
| 2018/0342789 | A1* | 11/2018 | Jiang | H01Q 1/528 |
| 2018/0348825 | A1* | 12/2018 | Rittenhouse | G06F 1/1681 |
| 2019/0237848 | A1* | 8/2019 | Ramasamy | G06F 1/1677 |
| 2020/0076050 | A1* | 3/2020 | Nishioka | H01Q 1/2266 |
| 2020/0183465 | A1* | 6/2020 | Yoo | H01Q 1/2266 |

* cited by examiner

*Primary Examiner* — Thien M Le
(74) *Attorney, Agent, or Firm* — Prol Intellectual Property Law, PLLC; H. Kenneth Prol

(57) ABSTRACT

An information handling system to wirelessly transmit and receive data at an antenna may include a base housing chassis containing components of the information handling system including a processor and memory and including a C-cover and a metal D-cover; a display chassis assembly having a display screen and including an A-cover; a hinge mechanically coupling the display chassis assembly to the base housing chassis; a hinge gap integrated along a hinge between an edge of the A-cover and an edge of the metal D-cover; an antenna to emit a radio frequency signal to a contained hinge gap resonant cavity formed within the hinge gap; and a flexible printed circuit (FPC) having a ground line operatively coupling the base housing chassis to the display chassis assembly to form a ground path across the hinge gap to shunt excitation currents along the hinge gap and to determine a size of the contained hinge gap resonant cavity between the A-cover and D-cover to accommodate an operating frequency of the radio frequency signal or harmonics of the operating frequency.

20 Claims, 10 Drawing Sheets

SYSTEM AND METHOD FOR OPERATION OF A HINGE CAVITY ANTENNA

FIELD OF THE DISCLOSURE

The present disclosure generally relates to information handling systems, and more particularly relates to an information handling system including an antenna placed within a C-cover and D-cover assembly that uses a heat sink, hinge barrel, and flex cable to increase the operability of the antenna operatively coupled thereto.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components. The information handling system may also include telecommunication, network communication, and video communication capabilities. The information handling system may also include one or more buses operable to transmit communications between the various hardware components. The information handling system may also include telecommunication, network communication, and video communication capabilities. Information handling system chassis parts may include case portions such as for a laptop information handling system including the C-cover over components designed with a metal structure. The information handling system may be configurable such that the information handling system may operate an antenna formed within a C-cover and D-cover assembly.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
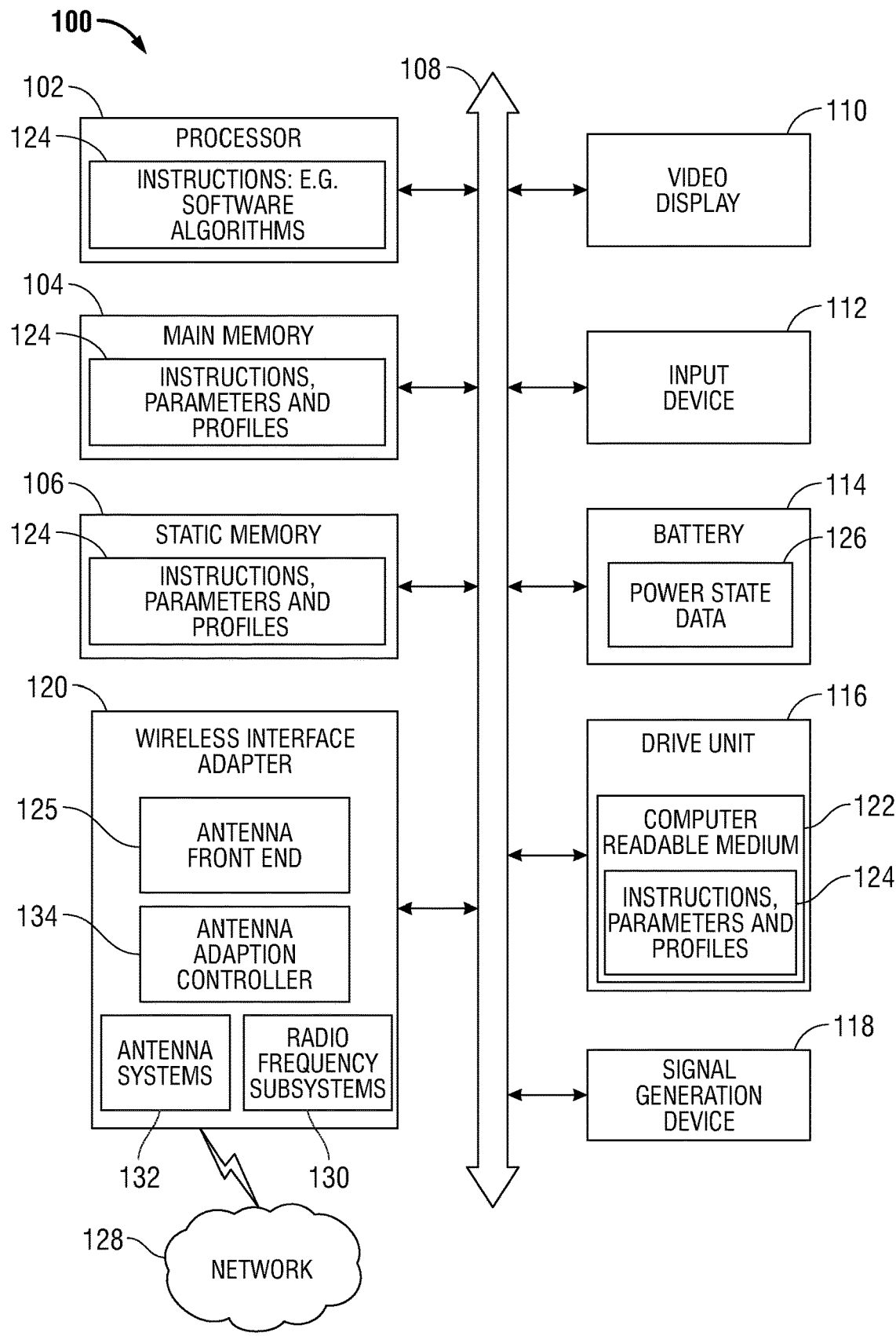
FIG. 1 illustrates an embodiment of information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

For aesthetic, strength, and performance reasons, information handling system chassis parts are more commonly designed with a metal structure. These metal structures are manufactured so as to have little or no sharp edges. During operation of an antenna, a metal chassis may be excited due to the metal structure and their conductive properties. Thus, the metal chassis do not have shape edges on them not only for aesthetic purposes but also so as to not provide, inadvertently, a location where radio frequency (RF) electromagnetic (EM) waves are propagated into space external to the information handling system.

In the embodiments described herein, a laptop information handling system may include a plurality of covers for the interior components of the information handling system. For example, a small form factor case may include an "A-cover" which serves as a back cover for a display housing and a "B-cover" which may serve as the bezel, if any, and a display screen of the convertible laptop information handling system in an embodiment. Together, the A-cover and B-cover may be assembled together to form a display portion of the information handling system (herein also described as an "A-cover/B-cover assembly"). In a further example, the laptop information handling system case may include a "C-cover" housing a keyboard, touchpad, and any cover in which these components are set and a "D-cover" base housing for the convertible information handling system. Together, the C-cover and D-cover may be assembled together to form a base portion of the information handling system (herein also described as a "C-cover/D-cover" assembly). With the need for utility of lighter, thinner, and more streamlined devices, the use of full metal portions for the outer covers of the display and base housing (e.g. the A-cover and the D-cover) is desirable for strength as well as aesthetic reasons. At the same time, the demands for wireless operation also increase. This includes addition of many simultaneously operating radiofrequency systems, addition of more antennas, and utilization of various antenna types. In addition to the use of metal chassis in a metal conductive information handling system, the thinner and more streamlined devices have fewer locations and areas available for mounting radiofrequency transmitters on these mobile information handling systems. Thus, a streamlined, full metal chassis capable of meeting the increasing wireless operation demands is described herein that allows for the increase in the size of the video display device as well as antenna systems.

Previous information handling systems would address these competing needs by providing for cutout portions of a metal outer chassis cover filled with plastic behind which radio transmitters would be mounted. The cutouts to accommodate radio frequency (RF) transmitters were often aesthetically undesirable and required additional plastic components to cover the cutout, thus failing to fully meet the streamlining needs. The plastic components added a component to be manufactured and were required to be seamlessly integrated into an otherwise smooth metal chassis cover. Further, the plastic portions included may be more expensive to machine than aluminum alloy metals, and may require intricate multi-step processes for integrating the metal and plastic parts into a single chassis. This requirement could require difficult and expensive processes to manufacture with a less desirable result. Other options included, for aperture type antenna transmitters, creation of an aperture in the metal display panel chassis and using the metal chassis as a ground plane for excitation of the aperture. Similarly, the visible apertures in the chassis cover were also less desirable, and the RF transmission hotspot would be located on the metal chassis cover itself. In the present specification and in the appended claims, the term "aperture" is meant to be understood as a physical gap or an opening oriented perpendicular to the direction of any transmitted or received electromagnetic (EM) wave that transmits and receives the same amount of power from those waves as that produced by an antenna. In some embodiments described herein, the aperture may be defined by an opening, such as in a chamber within a rotation portion formed as part of the drop barrel hinge. In another aspect, an aperture may be formed as part of an aesthetics or identification feature and may be formed as part of the hinge edge coupling points, the drop barrel hinge edge of the A-cover itself, a flex cable, portions of the C-cover/D-cover assembly, and/or other portions of the A-cover/B-cover assembly. In other embodiments, the space formed along the drop barrel hinge gap including the hinge edge coupling points, the drop barrel hinge edge of the A-cover itself, a flex cable, portions of the C-cover/D-cover assembly, and/or other portions of the A-cover/B-cover assembly may serve as a resonant cavity which works with the transceiving antenna which may be another aperture or a planar wire antenna in some embodiments.

In addition, in the case of a convertible laptop information handling system, 135- to 180-degree configurability may be a feature available to a user during use. Thus, often an antenna such as an aperture antenna system would be located at the top (e.g. "A-cover") with a plastic antenna window in a metal chassis cover to radiate in such as closed mode. Such a configuration would make the display panel housing (e.g. "A-cover") thicker, to accommodate antennas and cables behind the plastic panel at the top (or bottom) of either housing. Overall, a thicker convertible laptop information handling system would result, thus failing to meet the streamlining needs. A solution is needed that does not increase the thickness of the metal chassis, and does not require additional components and manufacturing steps such as those associated with installation of RF transparent windows.

Embodiments of the present disclosure may decrease the complexity and cost of creating chassis for information handling systems by forming the outer chassis (e.g. the A-cover and the D-cover) entirely of metal and providing for an antenna formed within the D-cover and C-cover assembly. This placement of the antenna into a location near a heat sink and near or within a hinge barrel assembly may allow for the grounding of certain RF EM waves that may excite the metal chassis and/or cause destructive interference of the RF EM waves propagated by the antenna. In an embodiment, a hinge gap may be formed between the A-cover and D-cover. The hinge gap causes any radio frequency (RF) electromagnetic (EM) radiation emitted from the antenna to also resonate therein when the antenna is located nearby because the hinge is made of metal. In one embodiment, a planar wire antenna may be located in a base chassis near the hinge of an information handling system such as a laptop information handling system with a drop barrel hinge. The planar wire antenna may transmit at a desired frequency but may incur resonance along a hinge gap of the drop barrel hinge between a metal A-cover and metal D-cover. This planar wire antenna of some embodiments may excite ground currents in the base chassis and keyboard surface of the C-cover and D-cover. Such resonance, especially along the hinge gap may be mitigated in some embodiments with a grounding cable as part of a flex cable for communications between the base chassis and display chassis across the hinge gap.

An aperture antenna, in certain other embodiments, can also be located near the A-cover to D-cover hinge gap. In such embodiments, the aperture antenna may be located in the drop barrel hinge and excite ground currents on the A-cover and hinge barrel as well as along a hinge gap formed between the A-cover and D-cover of the information handling system. In this embodiment, the hinge gap may be sized to form an aperture for the aperture antenna of the barrel hinge. The length of the hinge gap apertures may be sized in width by dimension of the gap and in length by the edge of the hinge gap and the position of a flex cable or other communication cable to extend a ground path across the hinge gap. Similar to the above embodiment, a flex cable or other communication cable across the hinge gap with grounding capability may also contain resonance of currents further along the hinge gap or elsewhere in the A-cover, barrel hinge, or base chassis to also regulate the radiation path of the antenna system.

In an embodiment of the present disclosure, an antenna aperture may be located in a hinge portion of the information handling system and formed within the hinge gap. In an embodiment for example, an antenna aperture may be located in a drop barrel hinge forming part of the A-cover and along a gap formed between the hinge barrel and D-cover. In the embodiments described herein, the drop barrel hinge is a portion of the A-cover hinged at the sides to the D-cover. The drop barrel hinge may drop back in the middle of the display portion when the laptop-type information handling system is placed in an open configuration.

In another embodiment, an antenna element may be located in a configurable cavity formed within the base chassis. This configurable cavity may house, in an embodiment a heat sink used to direct heat away from the information handling system. In such an embodiment, the base chassis may house a planar wire antenna that is located under the C-cover along the base chassis near the hinge gap. In yet other embodiments, an aperture antenna may be formed in the base chassis and transcieve RF EM waves near a hinge gap. In these types of antenna elements or aperture antenna locations near a hinge gap of a drop barrel hinge, resonance of transceived wireless signals may extend down the hinge gap or across the metallic surfaces of the C-cover, D-cover, A-cover, or hinge elements. Such unchecked resonance may deplete the wireless signal, cause polluting noise to information handling system elements, or interfere with the tranceived signal or other signals transcieved at other antenna systems of the information handling system.

In either embodiment, a flexible printed circuit (FPC) or any other type of flexible flat cable (FFC) may be formed across a configurable cavity at a location along the hinge gap so as to shunt any surface currents from reaching the components placed within the base chassis or display chassis or to contain currents from further travel down the hinge gap. During operation of the antenna elements, a hinge aperture antenna or a base chassis planar wire antenna for example as described herein, the RF EM waves emitted therefrom may interact with the metallic surfaces of the base chassis and display chassis causing currents to form. The FPC may be situated so as to help ground those currents before they propagate throughout the information handling system and further along the cavity formed of the hinge gap. In some embodiments, a grounding path may be formed to also direct those current to a grounding surface such as the D-cover where it can be dispersed without causing reduced signal or interference with the components of the information handling system. In an embodiment, a parasitic element may be used to direct those currents from the antenna element through a heat vent in the configurable cavity and to the D-cover. In other aspects, a parasitic element may be used to assist aperture antenna operation of the aperture antenna located in a drop hinge of the A-cover.

During operation of the antenna, whether the antenna is placed in the base portion or in the drop barrel hinge, the RF EM emissions by an antenna at the hinge gap may control, reduce, or eliminate resonances within the hinge gap with a flexible printed circuit or flexible flat cable or other grounding line across the hinge gap. In embodiments where multiple antennas are employed within the information handling system, any gap resonance may also cause cross-talk between the plurality of antennas. The gap resonance created by the hinge gap also creates directionality issues with regards to RF electromagnetic emissions. In some embodiments presented herein, the information handling system may include a ground wire in the form of a high-speed flex cable, a flexible printed circuit (FPC), a flexible flat cable (FFC), or other type of power or communication cable. The specific placement of the flex cable across the hinge gap forms a specific directional aperture along the hinge gap and helps to ground any excitation currents formed by the operation of the antenna element or antenna aperture from resonating further along the hinge gap or resonating elsewhere in the information handling system chassis. As a result, a relatively more focused transmission and reception power at frequencies that are emitted by the antenna element from a base chassis or an antenna aperture in a drop hinge barrel and its aperture along the hinge gap may be achieved.

The metal chassis in embodiments described herein may include a hinge operably connecting the "A-cover" to the "D-cover" such that the keyboard and touchpad enclosed within the "C-cover" and attached to the "D-cover" of the base portion of the information handling system may be placed in a plurality of configurations with respect to the digital display enclosed within the "B-cover" and attached to the "A-cover." The plurality of configurations may include, but may not be limited to, an open configuration in which the "A-cover" is oriented at a right or obtuse angle from the "D-cover" (similar to an open laptop computer) and a closed configuration in which the "A-cover" lies substantially parallel to the "D-cover" (similar to a closed laptop computer) such that the user can interact with the digital display enclosed within the "B-cover"). Despite these different configurations, however, the antenna cavity within a hinge barrel or formed near the hinge barrel and by the heat sink provides for the streamlining of the information handling system without compromising the ability of the antenna or antenna aperture to transmit and receive data from and to the information handling system.

Manufacture of embodiments of the present disclosure may involve fewer extraneous parts than previous chassis by forming the exterior or outer portions of the information handling system, including, at least, the bottom portion of the "D-cover" and the top portion of the "A-cover," in some embodiments, entirely from metal. In order to allow for manufacture of fully metallic outer chassis including the "A-cover" and the "D-cover," embodiments of the present disclosure form the full form factor case enclosing the information handling system such that one or more transmitting antennas within the antenna cavity integrated into a hinge barrel and base metal chassis (i.e., "D-cover") of the information handling system.

The transmitting antennas of embodiments of the present disclosure may include aperture antennas. Aperture antennas in embodiments of the present disclosure may be a highly effective improvement on wireless antennas employed in previous information handling systems. In embodiments of the present disclosure, an antenna aperture or slot may be placed in a location near or within the hinge barrel that mechanically couples the A-cover/B-cover assembly to the C-cover/D-cover assembly or may form part of the A-cover/B-cover assembly so as to couple the A-cover/B-cover to the C-cover/D-cover assembly of the information handling system. An aperture associated with the antenna in embodiments of the present disclosure may then be operably connected to grounding walls and/or grounding paths such that the RF EM signals reduce or limit exciting structures by the antennas that are not used for radiating wireless signals. Such a method of placing an aperture associated with the antenna at this location of the form factor case may exclude the integration of any RF transparent plastic windows within the exterior of "D-cover" or any other cover of the information handling system itself, thus decreasing the complexity and cost of manufacture. The antenna may then effectively transmit communications signal perpendicularly from, for example, the surface of the "D-cover" such as along a hinge gap between the D-cover and the A-cover. When the "D-cover" and "A-cover" are placed in either the open configuration the antenna in such an embodiment may transmit the communications signals away from the information handling system and into the nearby environment. When the "D-cover" and "A-cover" are placed in the closed configuration, the antenna may transmit and receive the communications signal out from the "D-cover" still allowing for transmission and receipt of data via the antenna.

Embodiments of the present disclosure may also allow the antenna to operate at higher power levels in the presence of human body parts than previous information handling systems with antennas located in the base housing chassis or "D-cover." The Federal Communications Commission (FCC) regulates the strength of radio frequency signals of an LTE antenna or other antenna systems within a commercial product sold in the United States may emit. Higher strength radio frequency signals may result in stronger signals and better communication, but may also increase the specific absorption rate (SAR), or rate at which energy is absorbed by the human body. The FCC requires LTE antennas within US commercial products to lower the power supplied to the LTE antenna when the antenna is in close proximity to a human body part in order to avoid any increase in SAR. The requirement of power reduction depends on hotspot radiofrequency SAR levels detected around the information handling system where a user may come into contact. Power reduction however may also have an adverse effect on radiofrequency system performance. SAR levels drop off significantly however with distance from an active transmitter. Thus, an antenna transmitter location and design where the active transmission element may be located further away from any surfaces potentially contacted by a user's body parts may not require as much power reduction.

In embodiments described herein, an antenna aperture of the "D-cover" may lie vertically lower than the keyboard of the "C-cover," which is the surface most likely to interface with human body parts. In such embodiments, placement of the transmitting antenna beneath the "C-cover" may place the antenna further away from human body parts than an information handling system placing the transmitting antenna directly beneath, alongside, or co-planar with the keyboard. However, a planar wire antenna or aperture antenna under the C-cover or along a back wall of the base chassis or an aperture antenna in a drop barrel hinge may avoid radiofrequency signals in the bottom D-cover which may be in contact with a user's lap and for which SAR levels may be carefully monitored. In some embodiments, an antenna element or antenna aperture may be formed in a location below the C-cover and near the hinge barrel or in the hinge barrel potentially creating a cavity at the hinge gap that re-radiates any RF signals (i.e., any type of electromagnetic radiation) therein. This cavity may limit the spread of the surface currents within the selected aperture antenna or reduce the effectiveness of a planar wire antenna element. Such reduction of RF radiation beyond the antenna element or antenna aperture may, at the A-cover and C-cover gap, decrease the radiation emitted outside the cavity. Accordingly, control of the signal transmitted via an antenna element or antenna aperture may be directed up towards the horizon with control of resonance at the hinge gap thereby improving a signal transmitted via the antenna aperture. Thus, smaller reductions in power supplied to the transmitter may be used in order to comply with FCC SAR regulations while providing similar or improved wireless signaling in such embodiments.

In some embodiments described herein, an antenna aperture may be formed, at least, partially within the hinge barrel. In such embodiments, placement of the transmitting antenna within the hinge barrel may also place the antenna further away from human body parts than an information handling system placing the transmitting antenna directly beneath, alongside, or co-planar with the keyboard. In some embodiments, an antenna cavity may be formed in a location below the C-cover and near the hinge barrel potentially creating a cavity that re-radiates any RF signals (i.e., any type of electromagnetic radiation) therein from the aperture antenna of the hinge barrel. This cavity may limit the spread of the surface currents within the aperture antenna if limitation of resonance down the hinge gap is limited as described. Such reduction of RF radiation beyond the antenna aperture and cavity intended to radiate the EM RF signal may, at the A-cover and C-cover gap, decrease the radiation emitted outside the cavity. As a result, the SAR of the signal transmitted via an antenna aperture may be directed up towards the horizon along the portion of the hinge gap desired for radiation or RF signals thereby improving a signal transmitted via the antenna aperture. Thus, smaller reductions in power supplied to the transmitter may be used in order to comply with FCC SAR regulations while providing similar or improved wireless signaling in such embodiments.

Examples are set forth below with respect to particular aspects of an information handling system including case portions such as for a laptop information handling system including the chassis components designed with a fully metal structure and configurable such that the information handling system may operate in any of several usage mode configurations.

FIG. 1 shows an information handling system 100 capable of administering each of the specific embodiments of the present disclosure. The information handling system 100, in an embodiment, can represent the mobile information handling systems 210, 220, and 230 or servers or systems located anywhere within network 200 described in connection with FIG. 2 herein, including the remote data centers operating virtual machine applications. Information handling system 100 may represent a mobile information handling system associated with a user or recipient of intended wireless communication. A mobile information handling system may execute instructions via a processor such as a microcontroller unit (MCU) operating both firmware instructions or hardwired instructions for the antenna adaptation controller 134 to achieve WLAN or WWAN antenna optimization according to embodiments disclosed herein. The application programs operating on the information handling system 100 may communicate or otherwise operate via concurrent wireless links, individual wireless links, or combinations over any available RAT protocols including WLAN protocols. These application programs may operate in some example embodiments as software, in whole or in part, on an information handling system while other portions of the software applications may operate on remote server systems. The antenna adaptation controller 134 of the presently disclosed embodiments may operate as firmware or hardwired circuitry or any combination on controllers or processors within the information handing system 100 for interface with components of a wireless interface adapter 120. It is understood that some aspects of the antenna adaptation controller 134 described herein may interface or operate as software or via other controllers associated with the wireless interface adapter 120 or elsewhere within information handling system 100. Information handling system 100 may also represent a networked server or other system from which some software applications are administered or which wireless communications such as across WLAN or WWAN may be conducted. In other aspects, networked servers or systems may operate the antenna adaptation controller 134 for use with a wireless interface adapter 120 on those devices similar to embodiments for WLAN or WWAN antenna optimization operation according to according to various embodiments.

The information handling system 100 may include a processor 102 such as a central processing unit (CPU), a graphics processing unit (GPU), or both. Moreover, the information handling system 100 may include a main memory 104 and a static memory 106 that can communicate with each other via a bus 108. As shown, the information handling system 100 may further include a video display unit 110, such as a liquid crystal display (LCD), an organic light emitting diode (OLED), a flat panel display, or a solid-state display. Display 110 may include a touch screen display module and touch screen controller (not shown) for receiving user inputs to the information handling system 100. Touch screen display module may detect touch or proximity to a display screen by detecting capacitance changes in the display screen as understood by those of skill. Additionally, the information handling system 100 may include an input device 112, such as a keyboard, and a cursor control device, such as a mouse or touchpad or similar peripheral input device. The information handling system may include a power source such as battery 114 or an A/C power source. The information handling system 100 can also include a disk drive unit 116, and a signal generation device 118, such as a speaker or remote control. The information handling system 100 can include a network interface device such as a wireless adapter 120. The information handling system 100 can also represent a server device whose resources can be shared by multiple client devices, or it can represent an individual client device, such as a desktop personal computer, a laptop computer, a tablet computer, a wearable computing device, or a mobile smart phone, among other computing devices.

The information handling system 100 can include sets of instructions 124 that can be executed to cause the computer system to perform any one or more desired applications. In many aspects, sets of instructions 124 may implement wireless communications via one or more antenna systems 132 available on information handling system 100. Operation of WLAN and WWAN wireless communications may be enhanced or otherwise improved via WLAN or WWAN antenna operation adjustments via the methods or controller-based functions relating to the antenna adaptation controller 134 described herein. For example, instructions or a controller may execute software or firmware applications or algorithms which utilize one or more wireless links for wireless communications via the wireless interface adapter as well as other aspects or components.

The antenna adaptation controller 134 may execute instructions as disclosed herein for monitoring wireless link state information, information handling system configuration data, SAR proximity sensor detection, or other input data to generate channel estimation and determine antenna radiation patterns. In the embodiments presented herein, the antenna adaptation controller 134 may execute instructions as disclosed herein to transmit a communications signal from an antenna located near a hinge barrel between the A-cover/B-cover assembly or a display portion and C-cover/D-cover assembly of the base portion of the information handling system. The execution of these instructions may create a resonant frequency at an aperture of the antenna cavity in a hinge gap there between to transmit an electromagnetic wave at a determined frequency or harmonics thereof. The antenna aperture cavity system of the embodiments herein may prevent noise caused due to the excitation of the display and base portion hinge gap outside the antenna cavity from creating interference with the determined frequency, or harmonics thereof, and reflecting transmission or receiving power for the antenna system.

In embodiments herein, a grounding system may be created at and within the antenna aperture cavity. In the embodiments presented herein, the antenna adaptation controller 134 may execute instructions as disclosed herein to adjust, via a parasitic element, a directionality and/or pattern of the emitted RF signals from the antenna. The antenna adaptation controller 134 may implement adjustments to wireless antenna systems and resources via a radio frequency integrated circuit (RFIC) front end 125 and WLAN or WWAN radio module systems within the wireless interface device 120. Aspects of the antenna optimization for the antenna adaptation controller 134 may be included as part of an antenna front end 125 in some aspects or may be included with other aspects of the wireless interface device 120 such as WLAN radio module or as part of the radio frequency subsystems 130. The antenna adaptation controller 134 described in the present disclosure and operating as firmware or hardware (or in some parts software) may remedy or adjust one or more of a plurality of antenna systems 132 via selecting power adjustments and adjustments to an antenna adaptation network to modify antenna radiation patterns and parasitic element operations according to some embodiments herein. Multiple WLAN or WWAN antenna systems may operate on various communication frequency bands such as under IEEE 802.11a and IEEE 802.11g providing multiple band options for frequency channels. Further antenna radiation patterns and selection of antenna options or power levels may be adapted due physical proximity of other antenna systems, of a user with potential SAR exposure, or improvement of RF channel operation according to received signal strength indicator (RSSI), signal to noise ratio (SNR), bit error rate (BER), modulation and coding scheme index values (MCS), or data throughput indications among other factors. In some aspects WLAN antenna adaptation controller may execute firmware algorithms or hardware to regulate operation of the one or more antenna systems 132 such as WLAN antennas in the information handling system 100 to avoid poor wireless link performance due to poor reception, poor MCS levels of data bandwidth available, or poor indication of throughput due to indications of low RSSI, low power levels available (such as due to SAR), inefficient radiation patterns among other potential effects on wireless link channels used.

Various software modules comprising software application instructions 124 or firmware instructions may be coordinated by an operating system (OS) and via an application programming interface (API). An example operating system may include Windows®, Android®, and other OS types known in the art. Example APIs may include Win 32, Core Java API, Android APIs, or wireless adapter driver API. In a further example, processor 102 may conduct processing of mobile information handling system applications by the information handling system 100 according to the systems and methods disclosed herein which may utilize wireless communications. The computer system 100 may operate as a standalone device or may be connected such as using a network, to other computer systems or peripheral devices. In other aspects, additional processor or control logic may be implemented in graphical processor units (GPUs) or controllers located with radio modules or within a wireless adapter 120 to implement method embodiments of the antenna adaptation controller and antenna optimization according to embodiments herein. Code instructions 124 in firmware, hardware or some combination may be executed to implement operations of the antenna adaptation controller and antenna optimization on control logic or processor systems within the wireless adapter 120 for example.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a PDA, a mobile information handling system, a tablet computer, a laptop computer, a desktop computer, a communications device, a wireless smart phone, wearable computing devices, a control system, a camera, a scanner, a printer, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions described herein.

The disk drive unit 116 may include a computer-readable medium 122 in which one or more sets of instructions 124 such as software can be embedded. Similarly, main memory 104 and static memory 106 may also contain computer-readable medium for storage of one or more sets of instructions, parameters, or profiles 124. The disk drive unit 116 and static memory 106 also contains space for data storage. Some memory or storage may reside in the wireless adapter 120. Further, the instructions 124 that embody one or more of the methods or logic as described herein. For example, instructions relating to the WLAN antenna adaptation system or antenna adjustments described in embodiments herein may be stored here or transmitted to local memory located with the antenna adaptation controller 134, antenna front end 125, or wireless module in radiofrequency subsystem 130 in the wireless interface adapter 120.

In a particular embodiment, the instructions, parameters, and profiles 124 may reside completely, or at least partially, within a memory, such as non-volatile static memory, during execution of antenna adaptation by the antenna adaptation controller 134 in wireless interface adapter 132 of information handling system 100. As explained, some or all of the WLAN antenna adaptation and antenna optimization may be executed locally at the antenna adaptation controller 134, RF front end 125, or wireless module subsystem 130. Some aspects may operate remotely among those portions of the wireless interface adapter or with the main memory 104 and the processor 102 in parts including the computer-readable media in some embodiments.

Battery 114 may include a smart battery system or be operatively coupled to a power management unit that tracks and provides power state data 126. This power state data may be stored with the instructions, parameters, and profiles 124 to be used with the systems and methods disclosed herein.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection and a wired connection may be present while operation of the wireless connection occurs. Wireless adapter 120 may include one or more radio frequency subsystems 130 with transmitter/receiver circuitry, modem circuitry, one or more antenna front end circuits 125, one or more wireless controller circuits such as antenna adaptation controller 134, amplifiers, antenna systems 132 and other radio frequency subsystem circuitry 130 for wireless communications via multiple radio access technologies. Each radiofrequency subsystem 130 may communicate with one or more wireless technology protocols. The radiofrequency subsystem 130 may contain individual subscriber identity module (SIM) profiles for each technology service provider and their available protocols for subscriber-based radio access technologies such as cellular LTE communications. The wireless adapter 120 may also include antenna systems 132 which may be tunable antenna systems or may include an antenna adaptation network for use with the system and methods disclosed herein to optimize antenna system operation. Additional antenna system adaptation network circuitry (not shown) may also be included with the wireless interface adapter 120 to implement WLAN or WWAN modification measures as described in various embodiments of the present disclosure.

In some aspects of the present disclosure, a wireless adapter 120 may operate two or more wireless links. In a further aspect, the wireless adapter 120 may operate the two or more wireless links with a single, shared communication frequency band such as with the Wi-Fi WLAN operation or 5G LTE standard WWAN operations in an example aspect. For example, a 5 GHz wireless communication frequency band may be apportioned under the 5G standards for communication on either small cell WWAN wireless link operation or Wi-Fi WLAN operation as well as other wireless activity in LTE, WiFi, WiGig, Bluetooth, or other communication protocols. In some embodiments, the shared, wireless communication bands may be transmitted through one or a plurality of antennas. Other communication frequency bands such as 2.4 GHz are contemplated for use with the embodiments of the present disclosure as well.

In embodiments herein, two antenna systems may be used and the antenna aperture cavity of the present disclosure may limit extension of RF excitation of the hinge gap between the two antennas. Thus, interference or other issues between a plurality of antennas along an A-cover to D-cover hinge gap may be minimized.

In other aspects, the information handling system 100 operating as a mobile information handling system may operate a plurality of wireless adapters 120 for concurrent radio operation in one or more wireless communication bands. The plurality of wireless adapters 120 may further operate in the wireless communication bands or operate in nearby wireless communication bands in some disclosed embodiments. Further, harmonics, environmental wireless conditions, and other effects may impact wireless link operation when a plurality of wireless links are operating as in some of the presently described embodiments. The series of potential effects on wireless link operation may cause an assessment of the wireless adapters 120 and potentially make antenna system adjustments according to the WLAN antenna adaptation control system of the present disclosure.

The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. Wireless adapter 120 and antenna adaptation controller 134 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers which may operate in both licensed and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band. WLAN, for example, may also operate at a 2.4 GHz band. WWAN may operate in a number of bands, some of which are propriety but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well. In the example embodiment, mobile information handling system 100 includes both unlicensed wireless radio frequency communication capabilities as well as licensed wireless radio frequency communication capabilities. For example, licensed wireless radio frequency communication capabilities may be available via a subscriber carrier wireless service. With the licensed wireless radio frequency communication capability, WWAN radiofrequency front end may operate on a licensed WWAN wireless radio with authorization for subscriber access to a wireless service provider on a carrier licensed frequency band.

The wireless adapter 120 can represent an add-in card, wireless network interface module that is integrated with a main board of the information handling system or integrated with another wireless network interface capability, or any combination thereof. In an embodiment the wireless adapter 120 may include one or more radio frequency subsystems 130 including transmitters and wireless controllers such as wireless module subsystems for connecting via a multitude of wireless links under a variety of protocols. In an example embodiment, an information handling system may have an antenna system transmitter 132 for 5G small cell WWAN, Wi-Fi WLAN or WiGig connectivity and one or more additional antenna system transmitters 132 for macro-cellular communication. The radio frequency subsystems 130 include wireless controllers to manage authentication, connectivity, communications, power levels for transmission, buffering, error correction, baseband processing, and other functions of the wireless adapter 120.

The radio frequency subsystems 130 of the wireless adapters may also measure various metrics relating to wireless communication pursuant to operation of an antenna system as in the present disclosure. For example, the wireless controller of a radio frequency subsystem 130 may manage detecting and measuring received signal strength levels, bit error rates, signal to noise ratios, latencies, power delay profile, delay spread, and other metrics relating to signal quality and strength. Such detected and measured aspects of wireless links, such as WLAN links operating on one or more antenna systems 132, may be used by the antenna adaptation controller 134 to adapt the antenna systems 132 according to an antenna adaptation network according to various embodiments herein. In one embodiment, a wireless controller of a wireless interface adapter 120 may manage one or more radio frequency subsystems 130. The wireless controller also manages transmission power levels which directly affect radio frequency subsystem power consumption as well as transmission power levels from the plurality of antenna systems 132. The transmission power levels from the antenna systems 132 may be relevant to specific absorption rate (SAR) safety limitations for transmitting mobile information handling systems. To control and measure power consumption via a radio frequency subsystem 130, the radio frequency subsystem 130 may control and measure current and voltage power that is directed to operate one or more antenna systems 132.

The wireless network may have a wireless mesh architecture in accordance with mesh networks described by the wireless data communications standards or similar standards in some embodiments but not necessarily in all embodiments. The wireless adapter 120 may also connect to the external network via a WPAN, WLAN, WWAN or similar wireless switched Ethernet connection. The wireless data communication standards set forth protocols for communications and routing via access points, as well as protocols for a variety of other operations. Other operations may include handoff of client devices moving between nodes, self-organizing of routing operations, or self-healing architectures in case of interruption.

In some embodiments, software, firmware, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit (ASIC). Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal; so that a device connected to a network 128 can communicate voice, video or data over the network 128. Further, the instructions 124 may be transmitted or received over the network 128 via the network interface device or wireless adapter 120.

Information handling system 100 includes one or more application programs 124, and Basic Input/Output System and firmware (BIOS/FW) code 124. BIOS/FW code 124 functions to initialize information handling system 100 on power up, to launch an operating system, and to manage input and output interactions between the operating system and the other elements of information handling system 100. In a particular embodiment, BIOS/FW code 124 resides in memory 104, and include machine-executable code that is executed by processor 102 to perform various functions of information handling system 100. In another embodiment (not illustrated), application programs and BIOS/FW code reside in another storage medium of information handling system 100. For example, application programs and BIOS/FW code can reside in drive 116, in a ROM (not illustrated) associated with information handling system 100, in an option-ROM (not illustrated) associated with various devices of information handling system 100, in storage system 107, in a storage system (not illustrated) associated with network channel of a wireless adapter 120, in another storage medium of information handling system 100, or a combination thereof. Application programs 124 and BIOS/FW code 124 can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2:
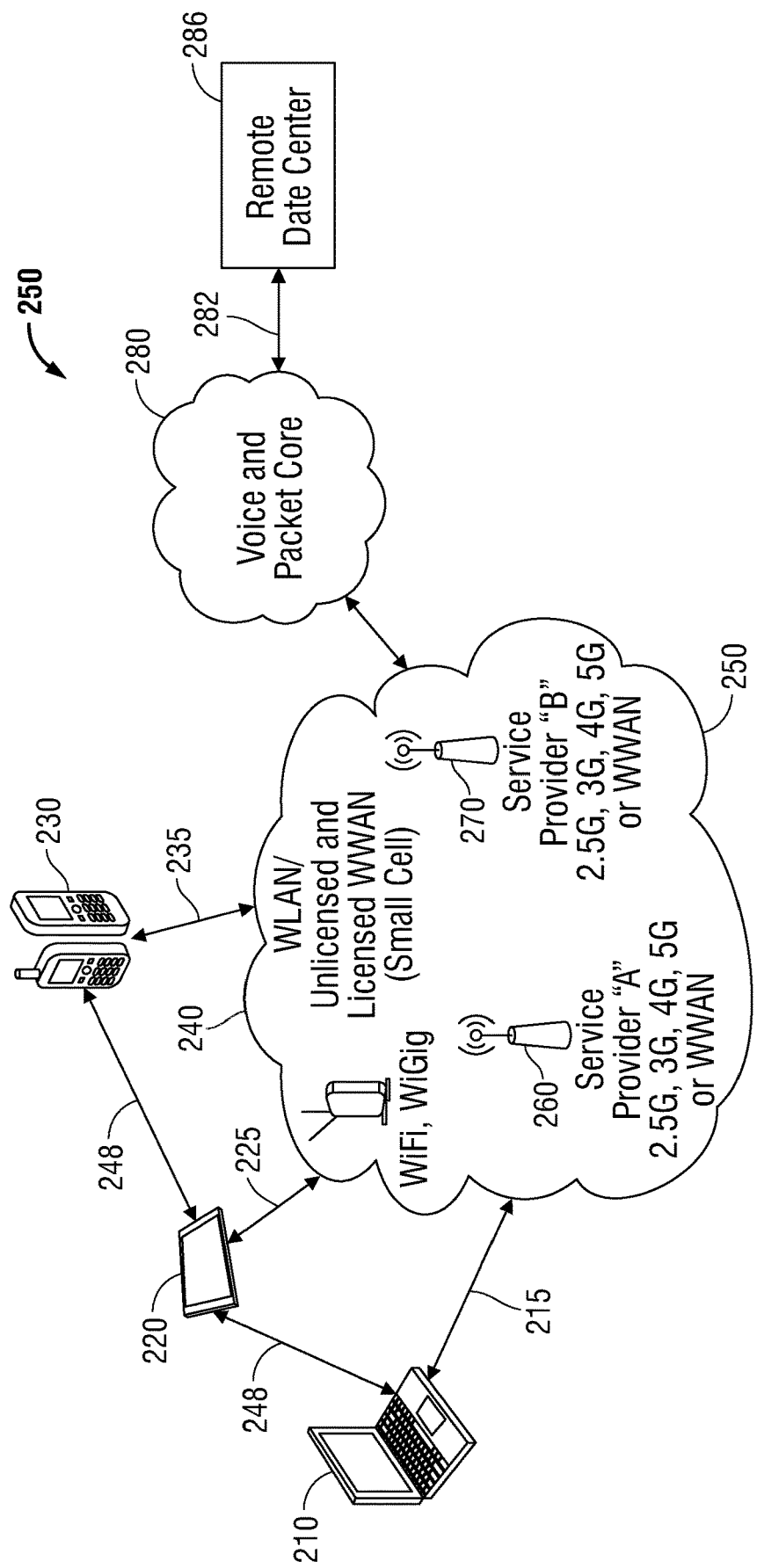
FIG. 2 is a block diagram of a network environment offering several communication protocol options and mobile information handling systems according to an embodiment of the present disclosure.

FIG. 2 illustrates a network 200 that can include one or more information handling systems 210, 220, 230. In a particular embodiment, network 200 includes networked mobile information handling systems 210, 220, and 230, wireless network access points, and multiple wireless connection link options. A variety of additional computing resources of network 200 may include client mobile information handling systems, data processing servers, network storage devices, local and wide area networks, or other resources as needed or desired. As partially depicted, systems 210, 220, and 230 may be a laptop computer, tablet computer, wearable computing devices, or a smart phone device. These mobile information handling systems 210, 220, and 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option.

Since WPAN or Wi-Fi Direct Connection 248 and WWAN networks can functionally operate similar to WLANs, they may be considered as wireless local area networks (WLANs) for purposes herein. Components of a WLAN may be connected by wireline or Ethernet connections to a wider external network. For example, wireless network access points may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, or 5G small cell WWAN communications such as eNodeB, or similar wireless network protocols. Alternatively, other available wireless links within network 200 may include macro-cellular connections 250 via one or more service providers 260 and 270. Service provider macro-cellular connections may include 2G standards such as GSM, 2.5G standards such as GSM EDGE and GPRS, 3G standards such as W-CDMA/UMTS and CDMA 2000, 4G standards, or 5G standards including WiMAX, LTE, and LTE Advanced, LTE-LAA, small cell WWAN, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells.

In some embodiments according to the present disclosure, a networked mobile information handling system 210, 220, or 230 may have a plurality of wireless network interface systems capable of transmitting simultaneously within a shared communication frequency band. That communication within a shared communication frequency band may be sourced from different protocols on parallel wireless network interface systems or from a single wireless network interface system capable of transmitting and receiving from multiple protocols. Similarly, a single antenna or plural antennas may be used on each of the wireless communication devices. Example competing protocols may be local wireless network access protocols such as Wi-Fi/WLAN, WiGig, and small cell WWAN in an unlicensed, shared communication frequency band. Example communication frequency bands may include unlicensed 5 GHz frequency bands or 3.5 GHz conditional shared communication frequency bands under FCC Part 96. Wi-Fi ISM frequency bands that could be subject to future sharing include 5 GHz, 2.4 GHz, 60 GHz, 900 MHz or similar bands as understood by those of skill in the art. Within local portion of wireless network 250 access points for Wi-Fi or WiGig as well as small cell WWAN connectivity may be available in emerging 5G technology. This may create situations where a plurality of antenna systems are operating on a mobile information handling system 210, 220 or 230 via concurrent communication wireless links on both WLAN and WWAN and which may operate within the same, adjacent, or otherwise interfering communication frequency bands. The antenna may be a transmitting antenna that includes high-band, medium-band, low-band, and unlicensed band transmitting antennas. Alternatively, embodiments may include a transceiving antenna capable of receiving and transmitting multiple bands. Each of the antennas included in the information handling system 100 in an embodiment may be subject to the FCC regulations on specific absorption rate (SAR). The antenna in the embodiments described herein may be a planar wire antenna element or similar antenna element or an aperture antenna with an antenna aperture cavity radiator before the A-cover and D-cover hinge gap. Aperture antennas and planar wire antenna elements or similar antenna elements in embodiments of the present disclosure may be a highly effective improvement on wireless antennas employed in previous information handling systems.

The voice and packet core network 280 may contain externally accessible computing resources and connect to a remote data center 286. The voice and packet core network 280 may contain multiple intermediate web servers or other locations with accessible data (not shown). The voice and packet core network 280 may also connect to other wireless networks similar to 240 or 250 and additional mobile information handling systems such as 210, 220, 230 or similar connected to those additional wireless networks. Connection 282 between the wireless network 240 and remote data center 286 or connection to other additional wireless networks may be via Ethernet or another similar connection to the world-wide-web, a WAN, a LAN, another WLAN, or other network structure. Such a connection 282 may be made via a WLAN access point/Ethernet switch to the external network and be a backhaul connection. The access point may be connected to one or more wireless access points in the WLAN before connecting directly to a mobile information handling system or may connect directly to one or more mobile information handling systems 210, 220, and 230. Alternatively, mobile information handling systems 210, 220, and 230 may connect to the external network via base station locations at service providers such as 260 and 270. These service provider locations may be network connected via backhaul connectivity through the voice and packet core network 280.

Remote data centers may include web servers or resources within a cloud environment that operate via the voice and packet core 280 or other wider internet connectivity. For example, remote data centers can include additional information handling systems, data processing servers, network storage devices, local and wide area networks, or other resources as needed or desired. Having such remote capabilities may permit fewer resources to be maintained at the mobile information handling systems 210, 220, and 230 allowing streamlining and efficiency within those devices. Similarly, remote data center permits fewer resources to be maintained in other parts of network 200.

In an example embodiment, the cloud or remote data center or networked server may run hosted applications for systems 210, 220, and 230. For example, remote data center, networked server, or some combination of both may operate some or all of an antenna system as disclosed in the present disclosure. The cloud or remote data center or networked server may run hosted applications for systems 210, 220, and 230 by establishing a virtual machine application executing software to manage applications hosted at the remote data center in an example embodiment. Mobile information handling systems 210, 220, and 230 are adapted to run one or more applications locally, and to have hosted applications run in association with the local applications at remote data center or networked servers. For example, mobile information handling systems 210, 220, and 230 may operate some or all of the antenna system or software applications utilizing the wireless links, including a concurrent wireless links, in some embodiments. The virtual machine application may serve one or more applications to each of mobile information handling system 210, 220, and 230. Thus, as illustrated, information handling systems 210, 220, and 230 may be running applications locally while requesting data objects related to those applications from the remote data center via wireless network. In another example, an electronic mail client application may run locally at system 210. The electronic mail client application may be associated with a host application that represents an electronic mail server. In another example, a data storage client application such as Microsoft® Sharepoint® may run on system 220. It may be associated with a host application running at a remote data center that represents a Sharepoint data storage server. In a further example, a web browser application may be operating at system 230. The web browser application may request web data from a host application that represents a hosted website and associated applications running at a remote data center.

Although 215, 225, and 235 are shown connecting wireless adapters of mobile information handling systems 210, 220, and 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower such as that shown with service provider A 260 or service provider B 270 and in network 250. In other aspects, mobile information handling systems 210, 220, and 230 may communicate intra-device via 248 when one or more of the mobile information handling systems 210, 220, and 230 are set to act as an access point or even potentially an WWAN connection via small cell communication on licensed or unlicensed WWAN connections. For example, one of mobile information handling systems 210, 220, and 230 may serve as a Wi-Fi hotspot in an embodiment. Concurrent wireless links to information handling systems 210, 220, and 230 may be connected via any access points including other mobile information handling systems as illustrated in FIG. 2.

Figure 3A:
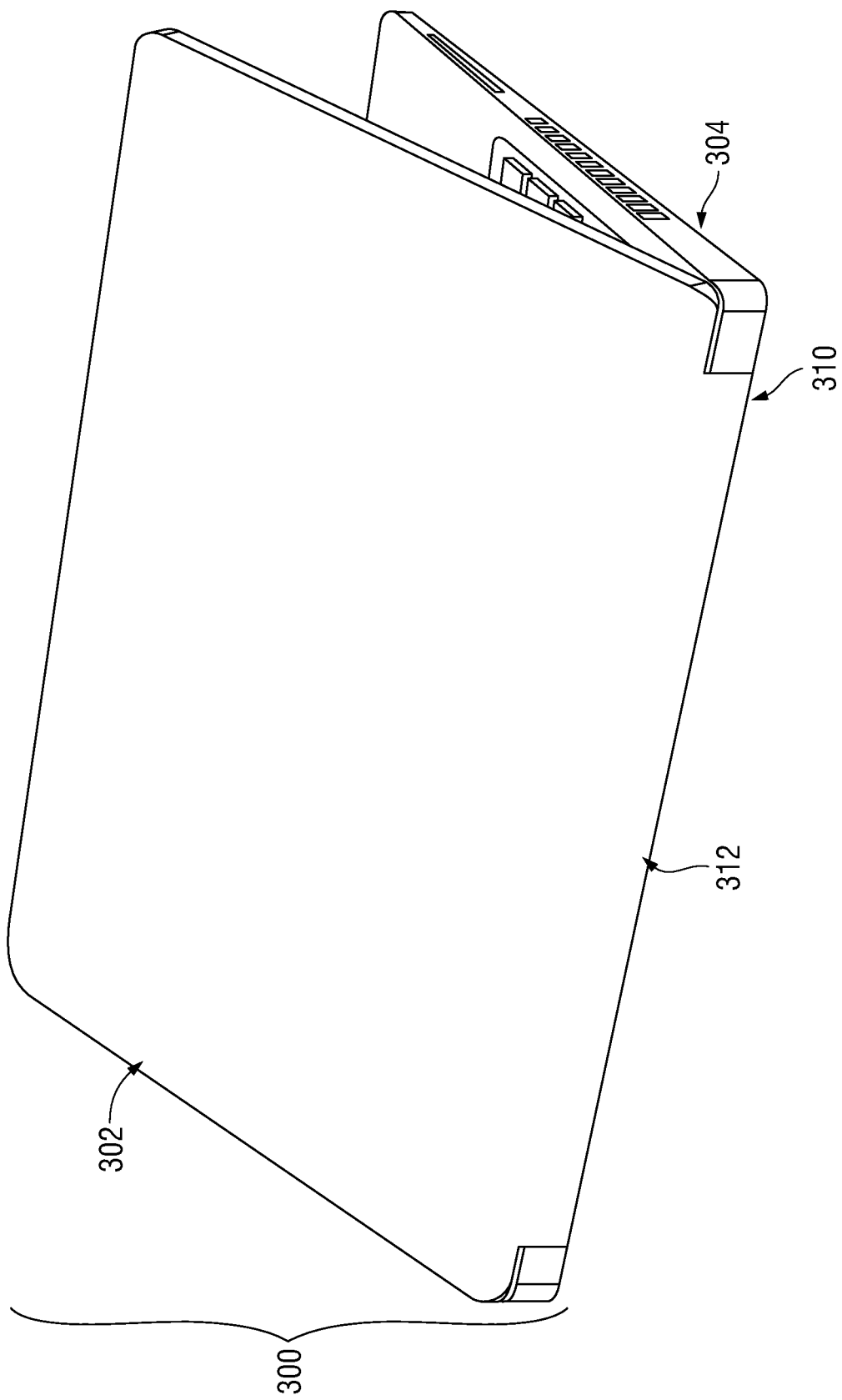
FIG. 3A is a graphical illustration perspective view of a metal chassis placed in a nearly closed configuration according to an embodiment of the present disclosure.

FIG. 3A is a graphical illustration of a metal chassis including a base chassis (i.e., including a C-cover and D-cover assembled together) and lid chassis (i.e., an A-cover and B-cover assembled together) placed in a nearly closed configuration according to an embodiment of the present disclosure. The metal chassis 300 in an embodiment may comprise an outer metal case or shell of an information handling system such as a tablet device, laptop, or other mobile information handling system. As shown in FIG. 3A, the metal chassis 300, in an embodiment, may further include a plurality of chassis or cases. For example, the metal chassis 300 may further include the A-cover 302 functioning to enclose a portion of the information handling system. As another example, the metal chassis 300, in an embodiment, may further include a D-cover 304 functioning to enclose another portion of the information handling system which may include a transmitting/receiving antenna according to the embodiments described herein. As shown in FIG. 3A, when placed in the nearly closed configuration, the A-cover 302 forms a top outer protective shell, or a portion of a lid for the information handling system, while the D-cover 304 forms a bottom outer protective shell, or a portion of a base. The C-cover and B-cover, in an embodiment, may also be formed of metal and may be viewable in the closed configuration shown in FIG. 3A. As also can be seen in FIG. 3A, in the closed configuration, the A-cover 302 and the D-cover 304 are substantially parallel to one another.

In some embodiments, both the A-cover and the D-cover may be comprised of metal. In some other embodiments, the A-cover or D-cover may include both metallic and plastic components. According to some embodiments of the present disclosure, the antenna element or aperture antenna and the antenna cavity may ground interference originating from the RF signals from the antenna with the metal of the A-cover 302 and D-cover 304 by grounding an antenna cavity along a hinge gap between the A-cover 302 and D-cover 304. The antenna cavity may be formed either within, at least partially, the hinge 312 (e.g., hinge barrel) or within the D-cover 304 near the hinge barrel with a grounding system such as a heat sink and flexible printed circuit (FPC) or a flexible flat cable (FFC) that may be used to form an aperture within the gap between the A-cover 302 and D-cover 304. The FPC may be referred to as a flexible cable herein and may be a flat cable or any other cable used to connect communications, power, data, or grounding between the display housing chassis and the base housing chassis. For example, an FPC or other cable may include one of a touch display FPC, an embedded display port (eDP) FPC, or a camera FPC in some embodiments. The flexible flat cable or other flexible cable such as a flexible flat cable (FFC) may include a grounding cable or may have sheathing that includes a grounding strip or other element that may be used in embodiments herein to shunt surface RF currents induced by the antenna aperture and cavity using the outer conductive sheathing while the sheathing also acts as an insulator barrier for the high-speed digital communication between the devices housed within the display chassis and base chassis. Without the FPC, RF noise may pollute the operations of those devices. In some embodiments, the FPC or other flexible cable may be used to ground a metal A-cover to a metal D-cover across a hinge gap according to embodiments herein.

In an embodiment, the A-cover 302 may be movably connected to a back edge of the D-cover 304 via one or more hinges. The A-cover 302 may be operably connected to the one or more hinges such that a gap is disposed between the A-cover 302 and the one or more hinges, in an embodiment. This gap 314 is formed due to the mechanical functionalities of the hinge allowing the A-cover/B-cover assembly and C-cover/D-cover assembly to move relative to each other as described herein. In the shown embodiment of FIG. 3A, a drop barrel hinge 312 may operably connected on either side along an edge of A-cover 302 with one or more hinge edge coupling points 310 of D-cover 304. In such an embodiment, the A-cover 302 may include the drop barrel hinge 312 that forms a part of the A-cover 302. In this embodiment, the drop barrel hinge 312 formed between the A-cover 302 and the D-cover 204 may be used to, at least, partially house an aperture antenna in some embodiments as well as form a resonant cavity therein. The drop barrel hinge may drop back in the middle along the hinge edge of the display portion when the laptop-type information handling system is placed in an open configuration. A hinge gap may be formed between the A-cover 302 and D-cover 304. The hinge gap causes any radio frequency (RF) electromagnetic (EM) radiation to resonate therein when an aperture antenna or planar wire antenna or other antenna element is located nearby because the hinge barrel A-cover 302 and the D-cover 304 is made of metal. In an embodiment, in order to prevent such resonances, an FFC may be used to regulate the RF EM path and produce effects on the characteristics of the emitted RF EM waves such as grounding of excitation currents and increasing coverage of the emitted RF EM waves.

In one embodiment, an antenna element such as a planar wire antenna can be located in a base portion of the information handling system under the C-cover and near the hinge gap. In some embodiments, such a location of a planar wire antenna may be also located by a heat sink or other potentially resonating structures of the information handling system. In this embodiment, the FPC may also be used to ground any excitation currents as well as form a configurable resonant cavity within the drop barrel hinge and hinge gap. In some examples, the planar wire antenna may be placed to resonate through an antenna window in the C-cover or may be placed into a heat vent along a back edge of the base chassis along the hinge gap. In some embodiments, a parasitic element may also be included along with the planar antenna element to help ground any excitation currents through the heat vent or upwards through an antenna window. The FPC across the hinge gap may be used to ground currents in the resulting hinge gap resonant cavity and between the A-cover and the D-cover to be dispersed.

In other embodiments, an aperture antenna may be located in a hinge barrel of the drop barrel hinge or may be located along the back edge of the base chassis or under the C-cover. In the case of an aperture antenna, the resonant cavity of the hinge gap may be used to resonate at core frequency bands or harmonics but may be sized by the FPC across the hinge gap. The FPC across the hinge gap may also be similarly used to ground currents in the resulting hinge gap resonant cavity from extending down the hinge gap, minimize cross talk with other antennas, or effect digital electronics located nearby when grounded between the A-cover and the D-cover to disperse ground currents from beyond the resonant cavity of the present embodiments.

Figure 3B:
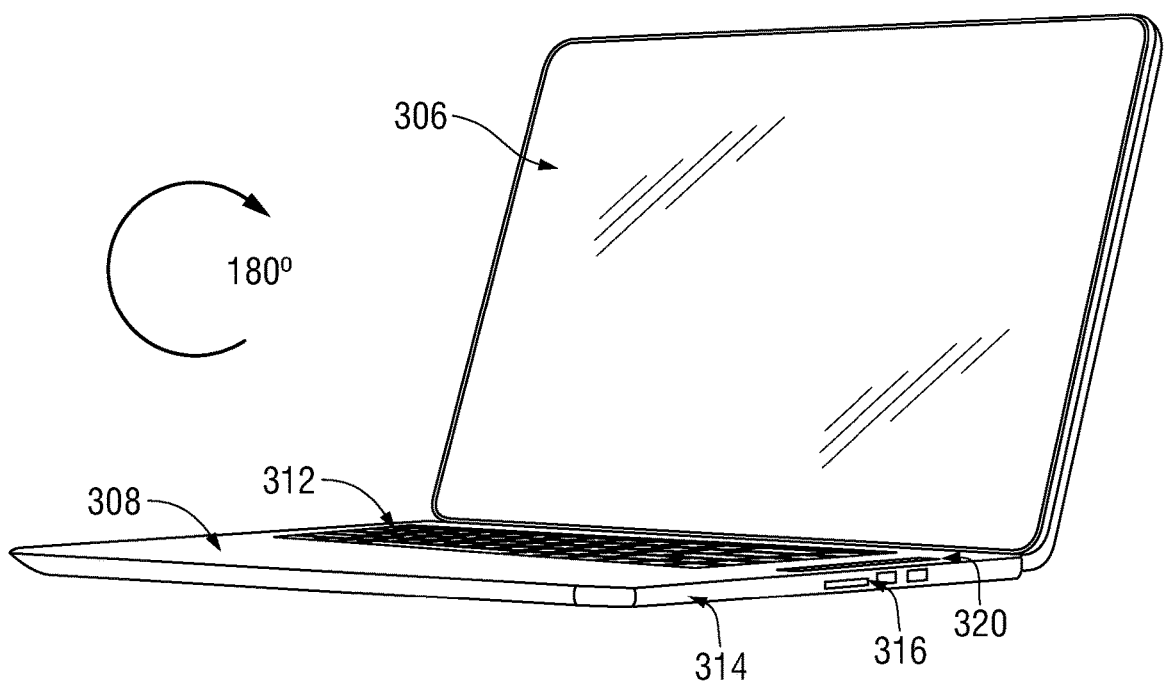
FIG. 3B is a graphical illustration perspective view of a metal chassis placed in the open configuration according to an embodiment of the present disclosure.

FIG. 3B is a graphical illustration of a metal chassis 300 including a base chassis and lid chassis placed in the open configuration according to an embodiment of the present disclosure. The metal chassis 300 in an embodiment may further comprise an outer metal case or shell of an information handling system for housing internal components of the information handling system, such as a video display, a cursor control device, and an alpha numeric input device. As shown in FIG. 3B, the metal chassis 300 may further include the B-cover 306 (or alternatively a display surface with no bezel) functioning to enclose the video or digital display device with the A-cover described herein. As another example, the metal chassis 300 may further include the C-cover 308 functioning to enclose the cursor control device and/or the keyboard 112 acting as an alpha numeric input device within a base chassis portion with the D-cover. The A-cover 302 and the B-cover 306 may be joined together in an embodiment to form a fully enclosed lid chassis (i.e., an A-cover/B-cover assembly), while the C-cover 308 and the D-cover 304 may be joined together to form a fully enclosed base chassis (i.e., a C-cover/D-cover assembly). As described herein, the base chassis and display chassis may contain several addition components of an information handling system as described with respect to FIG. 1. Taking the closed configuration as a reference position of the lid chassis including the A-cover 302 and the B-cover 306 and the base chassis including the C-cover 208 and the D-cover 304, the lid chassis including the A-cover 302 and the B-cover 306 may be rotated away from the base chassis including the C-cover 308 and the D-cover 304. For example, as shown in FIG. 3B, when placed in the open configuration, the lid chassis including the A-cover 302 and the B-cover 306 may be rotated away from the C-cover 308 and placed at an angle less than 180 degrees from the base chassis including the C-cover 308 and the D-cover 304, such that a user may view the digital display within the B-cover 306 and interact with the cursor control device and/or keyboard 112 within the C-cover 308.

As described herein, the hinge gap formed between the A-cover 302 and D-cover 304 causes any radio frequency (RF) electromagnetic (EM) radiation to, in an embodiment, resonate therein when an aperture antenna is located therein because the edges of the A-cover 302 and D-cover 304 about the hinge are made of metal. According to a number of embodiments, an aperture antenna can be located in two spots near the hinge gap between the A-cover to D-cover in some example embodiments. For example, an aperture antenna may be located in a base portion of the information handling system under the C-cover and near the hinge gap. In another example, an aperture antenna may be located in a drop barrel hinge forming part of the A-cover and along a gap formed between the hinge barrel and D-cover. In the embodiments described herein, the drop barrel hinge is a portion of the A-cover along the bottom of the A-cover and hinged at its sides to the back edge of the D-cover. The drop barrel hinge may drop back in the middle of the A-cover bottom edge when the laptop-type information handling system is placed in an open configuration. In yet another embodiment as described in embodiments herein, a planar wire antenna or other antenna element may be located in a base chasses near the hinge gap and may cause resonance in the hinge gap cavity. In some embodiments, the antenna element may be located in the base chassis behind a plastic antenna window or may be located in a thermal or audio vent in the information handling system base chassis in some embodiments. Further discussion of embodiments herein are described below.

Figure 3C:
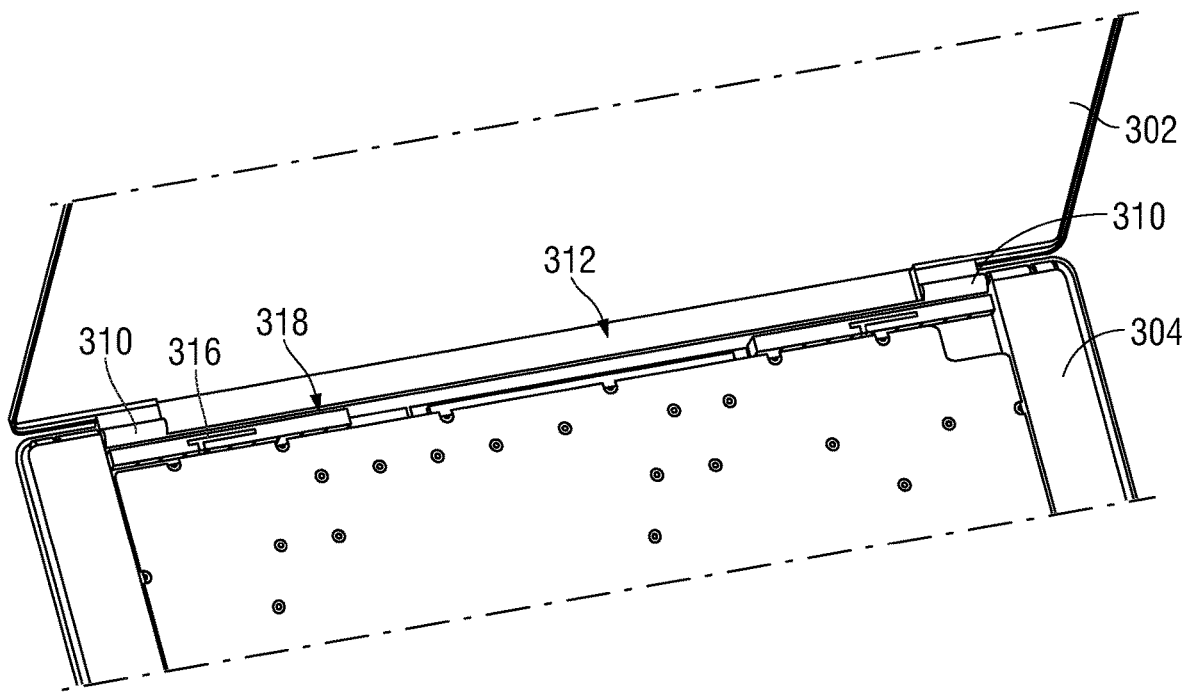
FIG. 3C is a graphical illustration top view of a metal hinge location between a display portion and a base portion of an information handling system according to an embodiment of the present disclosure.

FIG. 3C is a graphical illustration top view of a metal hinge location between a display portion including an A-cover and a base portion including a D-cover of an information handling system according to an embodiment of the present disclosure. In an embodiment, the hinge may be any type of hinge (e.g., part of a drop barrel hinge 312) that mechanically couples the A-cover/B-cover assembly of the display chassis portion to the C-cover/D-cover assembly of the base chassis portion so as to allow the display chassis to be rotated away from and to the base chassis. According to an embodiment of the present disclosure, the drop barrel hinge 312, operatively coupled at the hinge edge coupling points 310, may include an antenna 316 such as a planar wire antenna formed therein and located near the hinge gap of the drop barrel hinge 312 between the A cover and D cover. The placement of the planar wire antenna 316 near the hinge gap may be at a location close to the drop barrel hinge 312 with other elements associated with the operation of the antenna, such as antenna front end circuitry, being located in the hinge barrel 312 at the antenna.

The hinge may be any type of hinge, including a barrel drop-down hinge 312 similar to that shown and described in FIG. 3A, among others. In any embodiment herein, the hinge sides have hinge edge coupling points 310 and barrel hinge 312 may have an associated housing with it to cover portions of a hinge gap 318 that may be seen by a user during operation of the information handling system described herein. In the embodiment shown in FIG. 3C, an antenna 316 is formed in a cavity formed close to the hinge gap 318 between the A-cover 302 and D-cover 304 of the information handling system. In an embodiment, the base chassis near the hinge gap 318 may, in addition to the planar antenna 316, house a heat sink. During operation, the antenna 316 may emit RF EM radiation per execution of the computer instructions described herein. However, this RF EM radiation may be emitted from the antenna near the hinge gap 318 and may cause excitation currents to be formed at the metal structures of the information handling system including along edges of the A-cover 302, B-cover 306, C-cover 308, D-cover 304, and a heat sink located in the base chassis, among other structures. These structures may form a resonant cavity along the hinge gap 318. The heat sink may be any device that receives heat form the operation of the devices within the information handling system and redirects that heat out from the information handling system. The heat sink may be located along the back edge of the D-cover in some embodiments. The heat sink may be made of a heat conductive material such as metal and thus it may be excited by antenna 316 during operation. Thus, the planar wire antenna may transmit at a desired frequency but may incur resonance along the hinge gap 318 of the drop barrel hinge between a metal A-cover and metal D-cover. This planar wire antenna 316 of this embodiment may excite ground currents in the base chassis and keyboard surface of the C-cover and D-cover. Such resonance, especially along the hinge gap may be mitigated in some embodiments with a grounding cable across the hinge gap to contain resonance down the length of the hinge gap as well as limiting other resonance that may reduce the wireless signal levels or may interfere with other antenna systems or electronics in the information handling system. The grounding cable may be any of a flexible printed circuit (FPC) or any other type of flexible flat cable (FFC) that includes a conductive outer layer to ground the excitation currents between the A- and D-covers by forming a ground path between the A- and D-covers as well as mitigate the resonances formed in the resonant cavity. A resonant cavity may, therefore, be formed at the drop hinge barrel 312 according to FIG. 3C along the hinge gap 318. As shown in embodiments herein, a grounding line such as a conductive outer layer on a data and power cable or printed circuit between the D-cover and the A-cover may mitigate these excitation currents and resonant RF EM waves to prevent destructive interference and signal reduction.

In an embodiment, the resonant cavity formed near the hinge gap 318 may be designed to operate at a fundamental frequency (i.e., 2.4 GHz) of the antenna element. In an embodiment, a signal source may be fed into the planar antenna 316 so that that antenna element may operate at a quarter wavelength of the fundamental frequency (i.e., 2.4 GHz). The resonant cavity along hinge gap 318 may be sized with the grounding line across the hinge gap 318 in order to accommodate higher frequency modes operating close to any harmonics of the fundamental frequency.

As described in the embodiments herein, a flex cable may be used as a grounding source for containing the resonant cavity formed by the hinge gap 318. The flex cable may be used to ground any excitation currents across the hinge gap 318 between the D-cover 304 and A-cover 302 and contain the RF EM emissions at the location of the antenna 316 instead of along an entire length of the hinge 318 between the A-cover 302 an the D-cover 304. This may be beneficial in embodiments where multiple antennas 316 are employed in the information handling system. The containment of the RF EM emissions at the individual antennas 316 by the FPC prevents cross-talk among the antennas 316 due to resonance frequencies formed along the length of the hinge gap 318 between the antennas. Again this increases the transmission and reception characteristics of the antennas 316. Thus, the placement of the flex cable along the surface of the back edge of the hinge gap 318 and with respect to any heat sink and hinge edge coupling point 310 may allow for specific frequencies to be emitted by the antennas 316 and resonate within the hinge gap cavity without interference between them.

In another embodiment, the hinge gap 318 may resonate as a resonant cavity with respect to an aperture antenna (not shown) formed in the base chassis in the location of the shown antenna 316. In such an embodiment, the aperture antenna may be a monopole antenna that excites the aperture at a location of the base chassis along the hinge gap 318. The slot formed in the aperture antenna example of the base chassis may be operable at a half-wavelength of 2.4 GHz for examples and the monopole antenna 316 may be operated at a quarter wavelength of 5 GHz. With this embodiment configuration, the excitation currents of the described aperture antenna at the location of the shown antenna 316 will excite the hinge gap 318. Use of a grounding cable across hinge gap 318 may contain the resonant cavity by eliminating some or all of the cavity modes caused by the formation of the cavity between the drop hinge, A-cover, and D-cover. During operation, a signal source may be fed into the monopole antenna at the location of shown antenna 316 so that an aperture antenna slot at the location of antenna 316 may create higher frequency modes operating close to any harmonics of the fundamental frequency disclosed.

In the aperture antenna embodiment, the hinge is a barrel hinge 312 with hinge edge coupling points 310 including the aperture formed above the antenna 316 on the C-cover near the barrel hinge 312 or along a back edge of the base chassis in either the C-cover or D-cover back edge. In an embodiment, the antenna, such as a monopole antenna 316, may be placed directly in front of the barrel hinge and behind the aperture slot (not shown) to allow the aperture to resonate the RF EM waves transmitted or received by the aperture antenna via the hinge gap 318 between the A-cover 302 and the D-cover 304. In this embodiment, the size and dimensions of the aperture may vary based on a target RF EM waves to be emitted by the antenna system (for example, the monopole antenna such as at 316 and an aperture among other elements). In an embodiment, this target RF is 2.4 GHz and the size of the aperture may be 50 mm in length and sufficient to propagate such an RF wave. In an embodiment, the target RF is approximately 5 GHz with a sizing of the length of the aperture to be approximately 60 mm. In an embodiment, the entire length of the aperture may be equal to the hinge gap 318: approximately 240 mm and allowing for, in some embodiments, multiple sets of antennas and apertures to be formed within the barrel hinge 312. This may allow for multiple RF waves, either operating in a band or out of band, being transmitted and received by the information handling system thereby increasing the usability and communication capabilities of the information handling system. Thus, the information handling system may operate on multiple bands such as 2.4 GHz and any other RF bands (e.g, on the microwave scale) associated with long-term evolution (LTE) wireless broadband communications.

In an embodiment, the aperture associated with the drop barrel hinge aperture antenna may be angled away from the A-cover of the information handling system. This angling of the aperture is accomplished as the A-cover 302 is opened and the drop barrel hinge 312 angles the aperture up and away from the C-cover and D-cover 304. By angling the aperture away from the A-cover 302, RF EM loss from the antenna element against the display chassis or even the base chassis is minimized. Additionally, an open end of the aperture may be angled into the resonant cavity within the hinge gap 318 cavity located between the A-cover 302 and the D-cover 304.

Further, in each embodiment the resonant cavity along the hinge gap 318, that is contained according to embodiments herein, may be angled up and away from the A-cover 302 and C-cover 308. This causes the planar wire antenna or the aperture antennas of various embodiments near the antenna location as shown for antenna 316 to radiate into the cavity thereby exciting the hinge gap 318 causing the hinge gap 318 cavity to re-radiate any RF EM waves produced by the antenna 316 or aperture antenna. This re-radiation of the RF EM signals increases the coverage of the antenna 316, thereby increasing the efficiency and efficacy of the antenna 316 itself. Additionally, the hinge gap 318 cavity may limit the spread of the surface currents within the resonant cavity. Such reduction of RF radiation beyond the resonant cavity intended to radiate the EM RF signal may, at the A-cover and C-cover gap, decrease the EM radiation emitted outside the cavity. As a result, the signal transmitted via an antenna and aperture may be directed up towards the horizon along the portion of the hinge gap desired for radiation or RF signals thereby improving a signal transmitted via the antenna aperture. Thus, smaller reductions in power supplied to the transmitter may be used in order to comply with FCC SAR regulations while providing similar or improved wireless signaling in such embodiments.

In any embodiment presented herein, a plastic or other RF non-conductive material sheath may cover the antenna 316 or an aperture antenna slot in a similar location in the C-cover/D-cover assembly along the back edge of the D-cover 304. This sheath may prevent the antenna 316 or an aperture from coming in contact with dust or human touch thereby protecting the operative integrity of the antenna 316 or aperture antenna. Additionally, the sheath renders the look and feel of the information handling system pleasing to the user by completing the streamlined look of the information handling system. In an embodiment, this sheath may be made of plastic, glass, or other suitable non-conductive material.

As described herein, FIG. 3C also shows that a heat sink associated with the information handling system may be placed along an edge of a resonant cavity formed from the hinge gap 318. The heat sink may be any device transfers heat generated by an electronic or a mechanical device in a fluid medium (i.e., air or liquid coolant) where is it then dissipated away from the information handling system or the electronic or a mechanical devices therein via the heat sink so as to regulate the temperature within the information handling system. Along with the antenna 316 described herein, the heat sink may be placed close to an antenna 316, in one embodiment, or below an aperture, in another embodiment, at the location shown for the antenna 316 in the base chassis along a back edge of the D-cover 304. In another embodiment, the heat sink may also be placed near the aperture of an antenna located within the drop barrel hinge 312. In an embodiment, the heat sink 318 may be made of metal due to the thermal conductivity characteristics of metals and accordingly be excited or resonate in the presence of an EM RF field. Accordingly, the heat sink may be placed along the hinge gap 318 and serve as a portion of the formed hinge gap 318 cavity radiator in some embodiments.

During operation of the antenna 316, however, the metal forming the heat sink may be excited by the RF EM waves emitted by the antenna 316. This excitation may provide, inadvertently, a location where radio frequency (RF) electromagnetic (EM) waves are propagated into space external to the information handling system. This may interfere, in some examples destructively, with the operation of the antenna 316. Additional resonance may propagate down the hinge gap 318 and cause interference with other antenna systems or to electronics in the display chassis or base chassis. To prevent this, the present disclosure further describes the use of a grounding system that includes the flex cable used by the information handling system to also provide data transmission and/or power to other elements of information handling system such as the display in the display chassis portion. In this embodiment, the flex cable may provide a ground path (i.e., an electrical ground line) across the hinge gap 318 to the ground of the information handling system thereby tying the antenna 316 ground currents excited along the hinge gap 318 and at the heat sink through the flex cable to, in an example, between the A-cover 302 and the D-cover 304. Additionally, the placement of the flex cable may size the resonant cavity along the hinge gap 318 so as to excite additional resonant modes that can be bonded to primary modes in order to increase the bandwidth from antenna 316. Thus, the resonant cavity may be sized by the placement of the flex cable to enhance operation of the antenna 316 or any aperture antenna placed in a similar location. As described herein and in any embodiment described herein, the distance at which the flex cable is placed across the hinge gap 318 to form the hinge gap resonant cavity nearby to which the heat sink and antenna 316 or aperture antenna are placed along a back edge of the D-cover 304 causes the antenna 316 or aperture antenna to be tuned to resonate at the lowest operating frequency of the frequency bands supported by the antenna 316 or aperture antenna. This, therefore, tunes the resonant mode of the both the hinge gap 318 resonant cavity and the antenna 316 to be in phase thereby increasing the performance and coverage of the antenna 316 or similarly placed aperture antenna and causing both the antenna 316 and hinge gap 318 as well as the heat sink within this configurable cavity to get excited. This increases the antenna efficiency and pattern coverage thereby benefiting from the re-radiating RF EM waves. Additionally, the placement of the flex cable across the hinge gap 318 to form the hinge gap 318 resonant cavity relative to the antenna 316 or aperture antenna eliminates other RF bands being transmitted or received except those targeted by the antenna 316 or aperture antenna. The antenna 316 may be understood in the present embodiments to describe a planar wire antenna or other antenna element 316, a base chassis aperture antenna, or a drop barrel hinge aperture antenna all of which may be located adjacent to the hinge gap 318 and to benefit from the resonant cavity that is formed there. The flex cable, during operation of the antenna 316 shorts any excitation at half of the target wavelength: 50 mm at 2.4 GHz as described herein in an embodiment.

In an embodiment, the flex cable may include a shielding layer. In this embodiment, the ground wire of the flex cable may act as the grounding source as described herein and be a ground between the A-cover 302 and the D-cover 304. In one particular embodiment, the shielding layer may be coated or wrapped with a conductor to operate as a grounding wire for connection of the grounding between the A-cover 302 and the D-cover 304 across hinge gap 318. In other embodiments, the flex cable may have a grounding wire attributed to providing ground between the A-cover 302 and the D-cover 304 or an added grounding wire may be used with the flex cable. Specifically, the RF EM waves may be redirected to, in an example, the A-cover to which the hinge 312 is coupled to or, in another embodiment, to the D-cover. In an embodiment, the flex cable may be a high-speed display flex cable used to drive the video display device within the A-cover/B-cover assembly. Example flex cables include any one or a combination of a touch display FPC, an embedded display port (eDP) FPC, a camera FPC, or any other cable used to transfer power and/or data to and from any device within the A-cover 302 or D-cover 304. In these specific example flex cables, because the touch display, the eDP, and the camera devices are placed within the A-cover/B-cover assembly, a flex cable may communicatively and electrically couple these devices to a processor located within the C-cover/D-cover assembly of the information handling system. Accordingly, any of these flex cables may be used to also short any excitation of, for example, the hinge gap 318 beyond a desired hinge gap 318 antenna cavity length or any heat sink located along a back edge of the D-cover 304 to prevent any destructive interference occurring with the emitted and received RF EM signals from the antenna 316 or any similarly located aperture antenna in the base chassis or drop barrel hinge as well as contain the RF EM emissions at the locations of the antennas 316. Additionally, these FFC or FPC may be used to short any RF currents induced by the antenna aperture and cavity using the outer conductive sheathing while the sheathing also acts as an insulation barrier for any high-speed digital communication between the components of the display chassis and the base chassis from getting polluted by RF noise otherwise.

In another embodiment, the heat sink may be used along with a hinge barrel 312 with a cavity formed therein in the hinge gap 318 to re-radiate any radio frequency (RF) electromagnetic (EM) radiation therein. In this embodiment, the heat sink is located along the portion of the hinge gap 318 and is used to re-radiate the EM signal from antenna 316 or a similarly located aperture antenna in the base chassis or drop barrel hinge along the hinge gap 318. As described in more detail herein, the hinge gap 318 resonant antenna cavity may excite low-order frequencies such as cellular frequencies as well as other relatively higher-order frequencies such as those frequencies used in WiFi communications (i.e., ~5 GHz). This re-radiation of any RF EM radiation allows the cavity formed between the heat sink and barrel hinge 312 to be bounded by a hinge edge coupling point 310 and flex cable to be reused to radiate the lowest operating frequency of the antenna 316 or a similarly located aperture antenna. By tuning both the antenna 316 or aperture antenna and the resonant cavity mode to be in phase, an efficient antenna 316 performance and coverage is achieved as both the antenna 316 or aperture antenna and cavity re-radiates.

According to any embodiment described herein, the placement of the antenna 316 may be within the barrel hinge 312 or may be located in the D-cover 304 base chassis. For example, as described in embodiments above antenna 316 may be an aperture antenna with an antenna element such as shown placed behind a slot aperture in a cavity such that the antenna element is close enough to capacitively couple to the slot aperture such that it acts as an EM transmitter for the aperture antenna. An example aperture antenna is described and shown for the drop barrel hinge in FIG. 3E. Additionally, the slot aperture (not shown in FIG. 3C so the antenna element 316 is visible) may be placed over the antenna 316 shown in FIG. 3C such that it capacitively couples to the antenna element. In another aspect, a slot aperture may be located along a back edge of the base chassis near to the antenna element 316 for capacitive coupling to establish an aperture antenna along hinge gap 318 in some embodiments. Placement away from other locations of the display chassis portion allows for the video display device housed within the A-cover/B-cover assembly to increase in size. This increases the visible space of the video display device used by the user during operation of the information handling system while still allowing for wireless communication. Additionally, the placement of the antenna 316 such as an aperture antenna within the barrel hinge 312 or along the hinge gap 318 in the base chassis portion, in a specific embodiment, may allow for multiple antennas to be placed therein with the containment of the resonant cavity according to embodiments herein to facilitate the operation of the antennas at different RF EM waves such as those used in connection with Wi-Fi frequencies and LTE associated frequencies or multiple 5G protocol frequency bands among other frequencies.

In an embodiment, the antenna 316 may be a monopole antenna or a planar wire antenna coupled with a parasitic element. The monopole antenna 316 may comprise a straight conductor that acts as an open resonator oscillating with standing waves of voltage and current along its length. The length of the monopole antenna 316 may be set to operate based on the wavelength of the RF EM waves used during transmission and/or reception of the propagating signals. In an embodiment, the monopole antenna 316 may include a conducting plane (i.e., a grounding plane such as a grounding wall). In this embodiment, the conducting plane may reflect the EM waves emitted by the monopole antenna 316 so as to increase the gain of the antenna 316 within a cavity in the barrel hinge 312 or the D-cover 304 back edge. These EM RF waves emitted by the monopole antenna 316 within the antenna cavity may be conducted towards an aperture and emitted into the hinge gap 318 and re-radiated from hinge gap 318 antenna cavity of the information handling system as described in some embodiments herein. Because, in this embodiment, the antenna 316 is a monopole antenna, the length of the monopole antenna may be ¼ of the wavelength at which the antenna 316 is to operate. Consequently, the length of the antenna 316, the size of the aperture, and the length and size of the hinge gap 318 antenna cavity may be dependent on the wavelengths used by the information handling system as well as any governmental or industry standards under which the information handling system is to be operated and bonded constructively to provide a global band coverage by effectively re-using the available volume within this configurable cavity associated with the hinge gap 318. In an embodiment, the monopole antenna 316 may be sized to transmit and receive EM RF frequencies at or around 2.4 GHz. In an embodiment, the monopole antenna 316 may be sized to transmit and receive EM RF frequencies at or around any harmonic frequencies at or around 2.4 GHz.

In any embodiment described herein, the antenna 316, such as a planer wire antenna or an aperture antenna as described, may be associated with a parasitic element or other type of coupled device used to alter the pattern of the EM RF waves emitted by the antenna 316. The parasitic element may be grounded to a grounding wall. In an embodiment, the parasitic element may be used to steer the EM RF signals emitted by the antenna or towards the aperture and into the hinge gap or upwards from the C-cover 308 or barrel hinge 312. In an embodiment, the parasitic element may be operatively coupled to a variable impedance termination. In this embodiment, using a parasitic element with a variable impedance termination and which may be triggered by a switch, the information handling system may control the directionality of the transmission signal to thereby cause a shift of transmission pattern. The antenna adaptation controller 134 may control this aperture tuning for the antenna ports for the antenna to alter RF transmission pattern potentially improve RSSI, SNR, MCS or other performance factors. In an embodiment, the parasitic coupling element is designed to operate closer to a higher-frequency mode to aid with bonding and increasing global-band coverage.

Figure 3D:
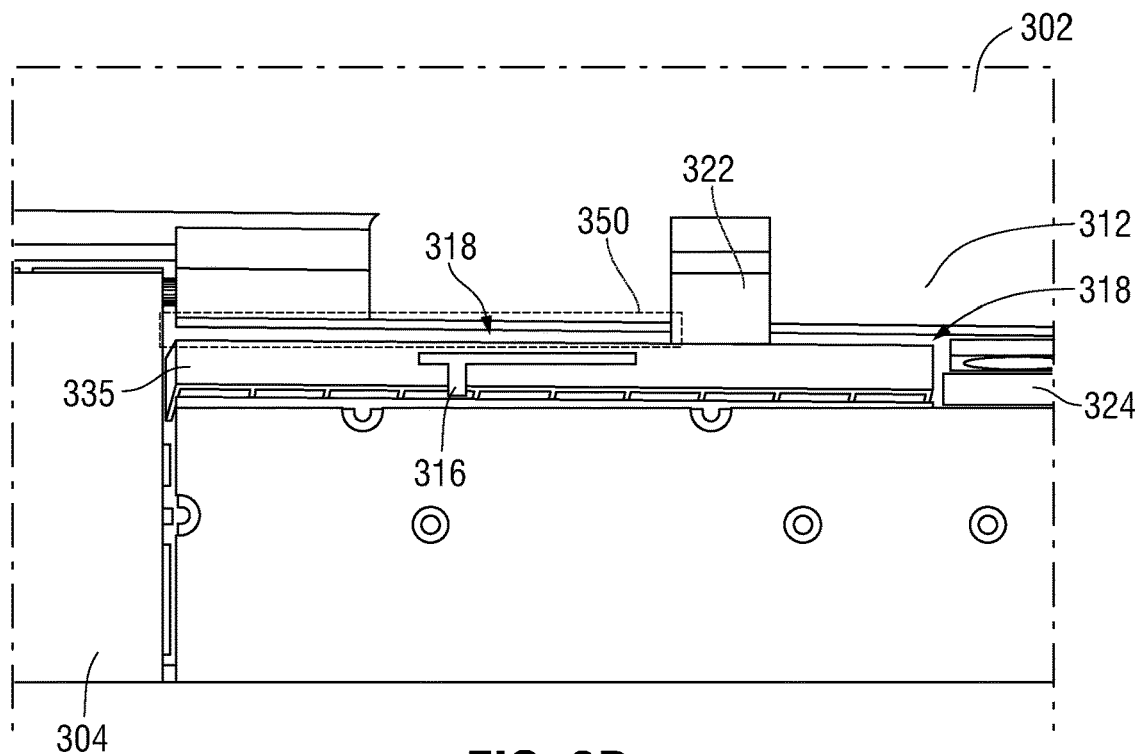
FIG. 3D is another graphical illustration top view of a metal hinge location between a display portion and a base portion of an information handling system according to an embodiment of the present disclosure.

FIG. 3D is another top view graphical illustration of a drop barrel hinge 312 location between an A-cover/B-cover assembly and C-cover/D-cover assembly according to an embodiment of the present disclosure. As shown, the A-cover 302 is shown without a B-cover and D-cover 304 is shown without a C-cover. FIG. 3D shows a hinge edge coupling point 310 mechanically coupling the drop barrel hinge 312 along the bottom edge of the A-cover 302 to the D-cover 304. The hinge edge coupling point 310 may include a pivoting coupling to the drop barrel hinge 312 such that the A-cover 302 and drop barrel hinge 312 may rotate about a hinge axis with respect to the D-cover 304. The drop barrel hinge 312 may be used to house a flex cable 322. As described in connection with FIG. 3C, the information handling system includes a hinge gap 318 and an antenna 316 formed within a cavity 335. While a drop barrel hinge 312 is shown, it may be understood that any type of hinge arrangement may provide for a hinge gap 318 along a back edge of D-cover 304 and near to antenna 316. FIG. 3D shows the flex cable 322 spanning the hinge gap 318 as described in embodiments herein for containment of the resonant cavity formed in the hinge gap 318.

Although FIG. 3D shows a single cavity 335, the present specification contemplates that other number of antenna cavities 335 may be formed along the hinge 312 as described in connection with FIG. 3C. In the shown embodiment, antenna cavity 335 is formed in the D-cover 304 along a back edge near hinge gap 318 such that the antenna cavity 335 would be underneath a C-cover (not shown). Further, along the hinge gap 318, but outside the flex cable 322 from antenna 316 location is shown an example location for a heat sink 324 along the back edge of the D-cover 304.

FIG. 3D additionally shows the flex cable 322 formed across the hinge gap 318 from the cavity 335 in the D-cover 304 to the A-cover 302 and placed with drop barrel hinge element 312. As described, in one embodiment, placement of flex cable 322 may be between the heat sink 324 and antenna 316 to mitigate resonance along hinge gap 318 to the heat sink 324. In other embodiments, the heat sink may be placed under antenna 316 as a bottom boundary of antenna cavity 335. In an embodiment, the flex cable 322, as shown in FIG. 3D, may run from a processor (not shown) placed within the D-cover 304, through a portion of the cavity 335, and to the A-cover 302 and components, such as a display, to be mounted within the display chassis portion of the information handling system. The flex cable 322 may pass through the cavity 335 to the D-cover 304 in an embodiment. In another embodiment, the flex cable 322 may be laid over a heat sink mounted under the antenna cavity 335. As descried herein, the flex cable 322 is used as a grounding path to ground the currents across the hinge gap 318 produced by the excitation of the hinge gap 318 by the RF EM waves produced by the antenna 316. Additionally, the grounding effects of the flex cable 322 may contain any RF EM emissions from the antenna 316 at the location of the antenna 316 and into a hinge gap antenna resonant cavity 350 bounded by the drop barrel hinge 312 of the A-cover 302, the D-cover 304, the hinge edge coupling point 310 and the flex cable 322 as shown. In an embodiment, the flex cable 322 may be used to ground the excitation currents between the D-cover 304 and the A-cover 302 and the location of the flex cable 322 may be used to size the hinge gap antenna resonant cavity 350 for the transmission and reception frequency bands operating on antenna 316. In order to ground these currents across the hinge gap 318 and avoid excitation of the heat sink under the antenna cavity, the flex cable 322 may include a conductive layer on the shielding or a ground wire that grounds these currents formed along the hinge gap 318 as described. In effect, the flex cable 322 shorts the excitation of any metal objects, including further along the A-cover 302 edge, the D-cover 304 edge, or the heat sink 318, to within the hinge gap antenna resonant cavity 350 thereby limiting the destructive interference of these currents with the RF EM signal emitted by the antenna 316 and aperture along the hinge gap 318 beyond an intended portion or from excitation of structures such as heat sink 324 and shunting them between the A-cover 302 and the D-cover 304. Additionally, these FFCs may be used to short RF currents induced by the antenna 316, such as a monopole antenna or an aperture antenna, and resonant cavity 350 using an outer conductive sheathing while the sheathing also acts as an insulation barrier for any high-speed digital communications between components within the display chassis and base chassis from getting polluted by RF noise otherwise.

Additionally, the placement of the flex cable 322 across the cavity 335 relative to the antenna 316 allows the antenna 316, any antenna aperture, and the hinge gap antenna resonant cavity 350 may be tuned in phase to a lowest operating frequency band based on size of the resulting resonant cavity 350. In an embodiment, this tuning may be accomplished by adjusting the position at which the flex cable 322 crosses the hinge gap 318 relative to the hinge edge coupling point 310. This operating frequency band may be the target RF communication band described herein set for the antenna 316, monopole or aperture antenna, from the antenna cavity 335. In an embodiment, this frequency band may be 2.4 GHz, harmonics therefore, 5 GHz, or harmonics thereof. Additionally, in an embodiment, the operating frequency may be any RF frequency that includes those used in operation of LTE wireless broadband communications.

In another embodiment, the antenna may be placed within the drop barrel hinge 312 itself for creating a hinge gap antenna resonant cavity 350 across hinge gap 318 with the antenna. As described herein in FIG. 3E and elsewhere, an aperture associated with the antenna 316 placed within the drop barrel hinge 312 may be angled away from the A-cover 302 of the information handling system due to the structure of the drop barrel hinge 312. By angling the aperture away from the A-cover 302, an open end of the aperture may be angled into the hinge gap antenna resonant cavity 350 from within the hinge 312 and located between the A-cover 302 and the D-cover 304. This causes the antenna aperture to radiate into the hinge gap antenna resonant cavity 350 from the drop barrel hinge 312 thereby exciting the hinge gap antenna resonant cavity 350 causing it to re-radiate any RF EM waves produced by the antenna 316 and aperture. This re-radiation of the RF EM signals increases the coverage of the antenna 316, thereby increasing the efficiency and efficacy of the antenna 316 itself. Additionally, the angling of the aperture away from the A-cover 302 causes the RF EM waves to be radiated upward and away from the C-cover thereby increasing the efficiency and coverage of the antenna 316. This increases user satisfaction when signals between, for example, the information handling system and an access point are weak or otherwise inaccessible without the presently described antenna 316 and its system.

Figure 3E:
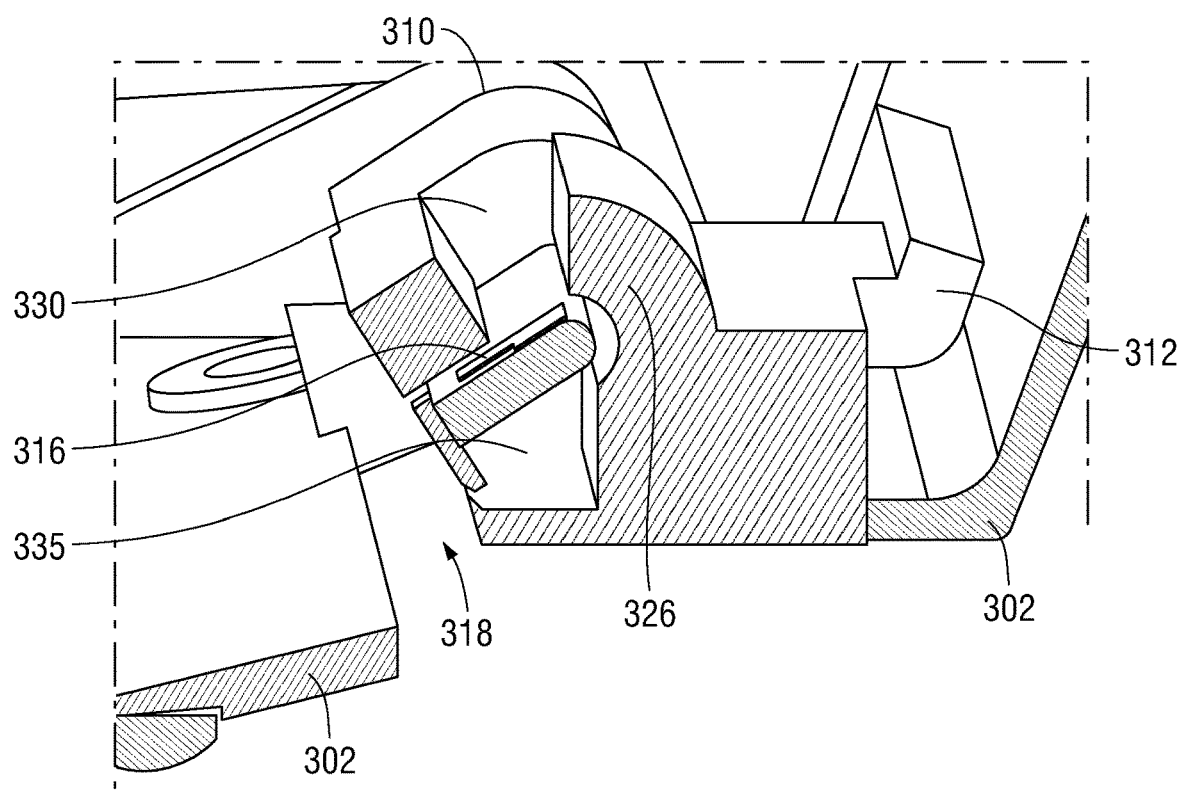
FIG. 3E is a graphical illustration side, cut-out view of a metal hinge location between a display portion and a base portion of an information handling system according to an embodiment of the present disclosure.

FIG. 3E is a side, cut-out view of a graphical illustration of a hinge edge coupling point 310 and drop-down barrel hinge 312 as located between a display portion including an A-cover 302 and a base portion including a D-cover 304 of an information handling system assembly according to an embodiment of the present disclosure. The side cutout view shows the formation of an aperture 330 over an antenna element 316 and a hinge gap 318 between the A-cover 302 edge and D-cover 304 edge with a radiating end of the aperture 330 being directed away from the A-cover 302. The antenna element 316 may be located near enough to the slot of aperture 330 to capacitively couple the signal to the aperture 330. Thus, aperture 330 and antenna element 316 may operate as an aperture antenna system as described according to embodiments herein.

The drop barrel hinge 312 may include a barrel grounding wall 326 formed into, for example, the drop barrel hinge 312 such as that shown and described in connection with FIG. 3A and FIG. 3E to form part of an antenna cavity 335 for antenna element 316. The barrel grounding wall 326 forms part of the A-cover 302. As described herein, the flex cable (not shown) may be used as a ground path (i.e., an electrical ground line) to the ground of the information handling system across the hinge gap 318. The barrel grounding wall 326 may serve as the portion of the A-cover 302 to which the currents are grounded to in the drop barrel hinge 312. In an embodiment, the flex cable may also prevent excitation currents formed by the operation of the antenna aperture 330 from resonating further along the hinge gap 318 or resonating elsewhere in the information handling system chassis away from the desired resonant cavity along hinge gap 318.

In the embodiment shown in FIG. 3E, the antenna element 316 may excite an aperture 330 such that RF EM waves propagate therefrom. The antenna 316 may be a monopole antenna 316 that excites the aperture 330. The slot formed in the aperture may be operable at a half-wavelength of 2.4 GHz for examples and the monopole antenna 316 may be operated at a quarter wavelength of 5 GHz. With this embodiment configuration, the excitation currents of the monopole antenna 316 may be controlled at the hinge gap 318 via inclusion of the flex cable thereby eliminating some or all of the cavity modes caused by the formation of the resonant cavity along the hinge gap 318 between the drop hinge and D-cover. In an embodiment, the display FPC may also provide additional ground to eliminate any additional cavity modes not previously eliminated.

In some embodiments, the emitted RF EM waves from the aperture 330 may re-resonate within the hinge gap 318. With embodiments herein, grounding the hinge gap to size the hinge gap resonant cavity as described may increase the efficiency of the antenna 316. As described herein, the hinge edge coupling point 310 further defines the hinge gap resonant cavity along with the flex cable. Such resonances formed within the resonant cavity, especially along the hinge gap 318 may be mitigated in some embodiments with a grounding cable of the flex cable placed between the base chassis and display chassis and across the hinge gap 318.

In an embodiment, the hinge gap 318 may be used along with the hinge edge coupling point 310 and the flex cable formed therein to re-radiate any radio frequency (RF) electromagnetic (EM) radiation therein based on dimension of the hinge gap resonant cavity formed by these structures with the hinge gap 318. The hinge gap resonant cavity may excite low-order frequencies such as cellular frequencies as well as other relatively higher-order frequencies such as those frequencies used in WiFi communications (i.e., ~2.5 GHz). This re-radiation of any RF EM radiation allows the hinge gap resonant cavity formed with hinge gap 318 to be reused to radiate the lowest operating frequency of the antenna 316.

Figure 4:
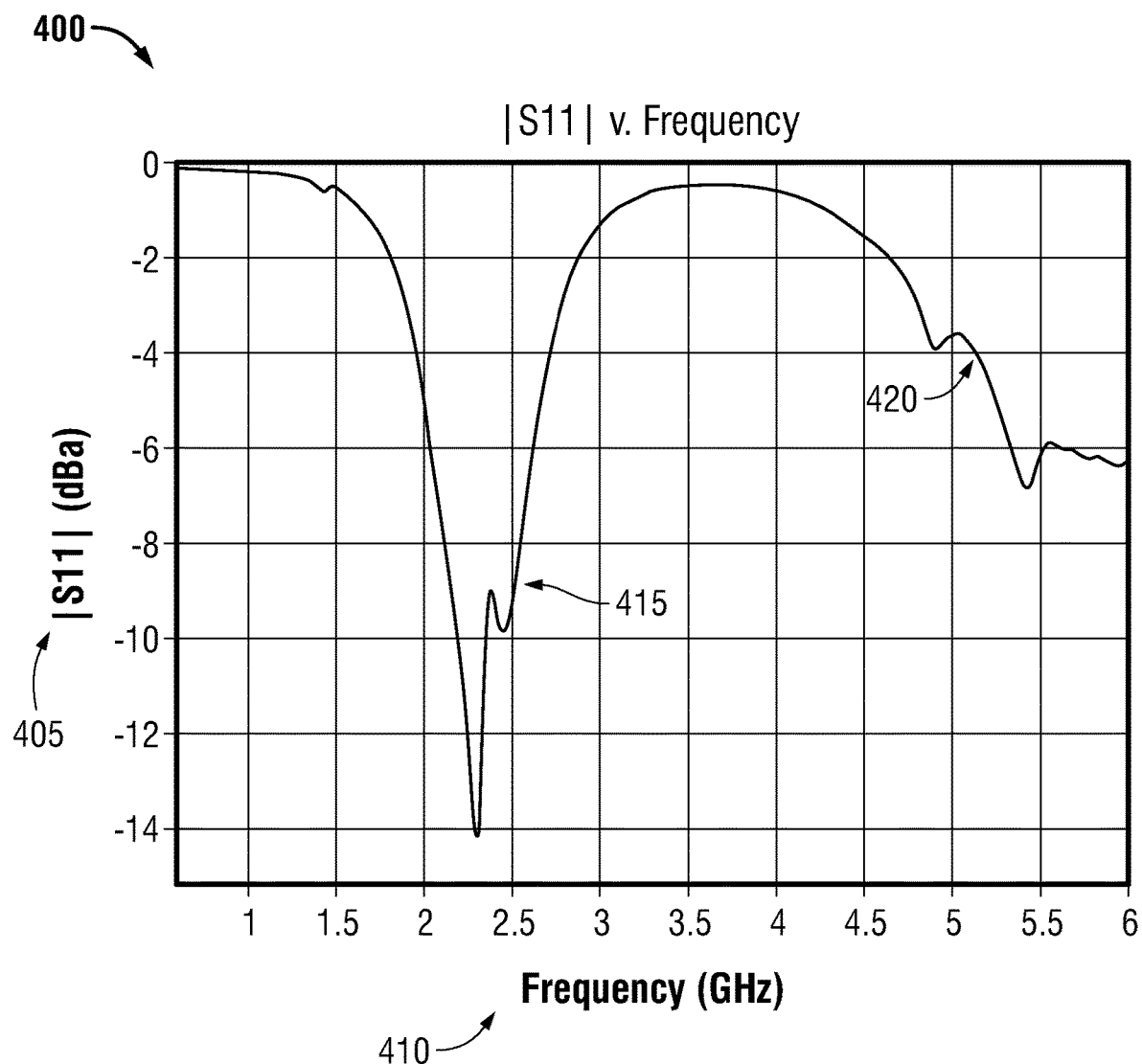
FIG. 4 is a graph showing values of return loss (in dBa) versus frequency of a RF wave according to an embodiment of the present disclosure.

FIG. 4 is a graph 400 showing values of return loss (in dBa) 405 versus frequency 410 of an RF wave according to an embodiment of the present disclosure. Graph 400 shows the return loss versus a frequency and may be measured using a vector network analyzer (VNA) that plots S11 values relative to frequency. An increase in return loss corresponds to a lower amount of power in the form of EM RF waves being delivered to an antenna by the antenna within the cavity. In an embodiment, the return loss may be resulting from RF EM waves being resonated within the hinge gap described herein. In the example, shown in FIG. 4, a first point 415 indicates a low power loss at around 2.4 GHz and a higher order mode 420 being a harmonic thereof. The exclusion of other frequencies is due to the configuration of the hinge gap resonant cavity within the hinge and the resonating characteristics thereof as well as the placement of the flex cable 322 across the hinge gap resonant cavity and the grounding characteristics described herein.

Figure 5:
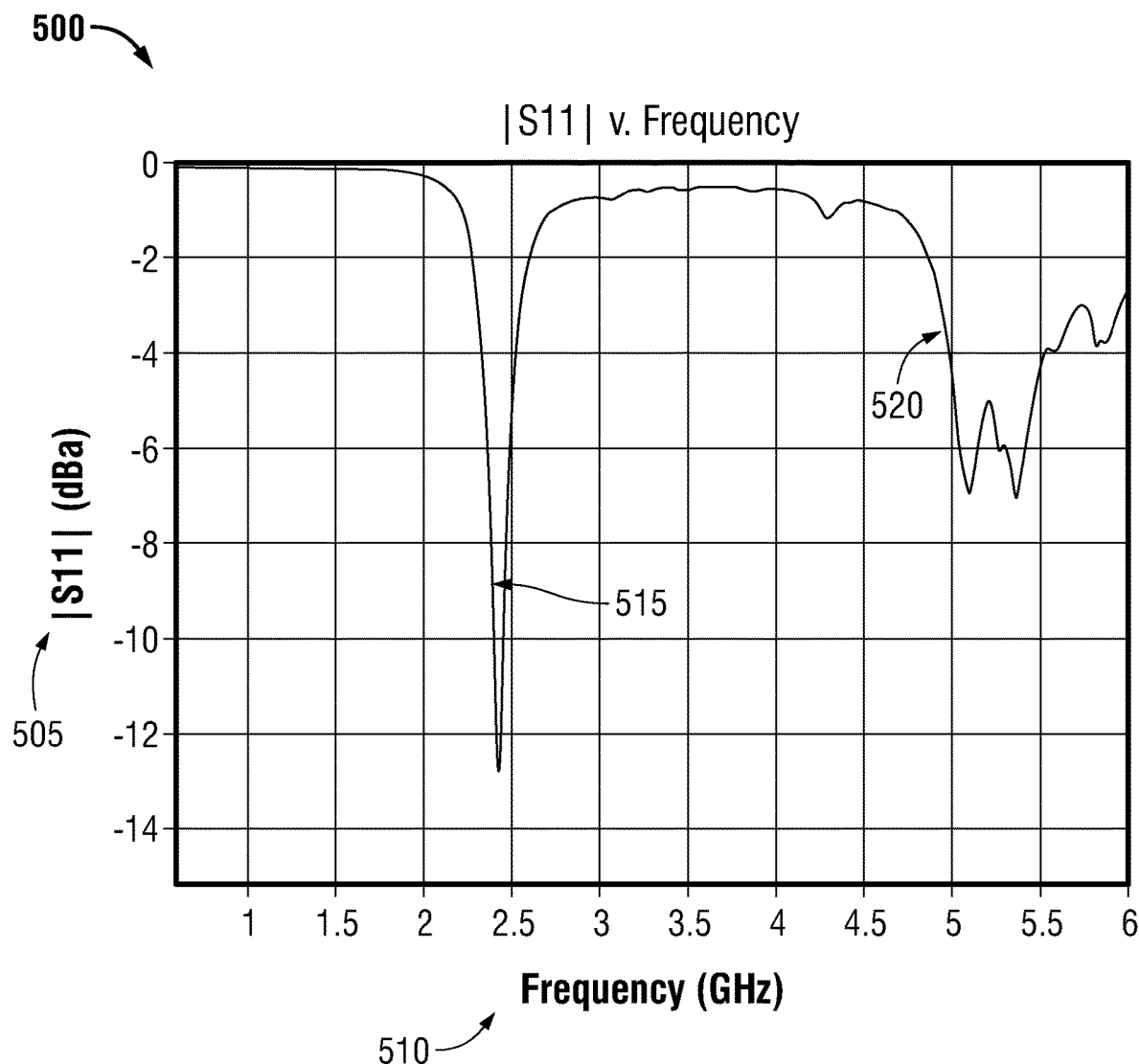
FIG. 5 is showing values of return loss (in dBa) versus frequency of a RF wave according to an embodiment of the present disclosure.

FIG. 5 is a graph 500 showing values of return loss (in dBa) 505 versus frequency 510 of an RF wave according to an embodiment of the present disclosure. Graph 500 shows the return loss versus a frequency and may be measured using a vector network analyzer (VNA) that plots S11 values relative to frequency. In an embodiment, the return loss of the antenna may be a result of the RF EM waves being lost in the C-cover. In the example, shown in FIG. 5, a first point 515 indicates a low power loss at around 2.4 GHz and a higher order mode 520 being a harmonic thereof. This is because of the size of the aperture 330 dictates that these certain frequencies are emitted by the antenna 316 and aperture 330 while excluding the other frequencies.

Figure 6:
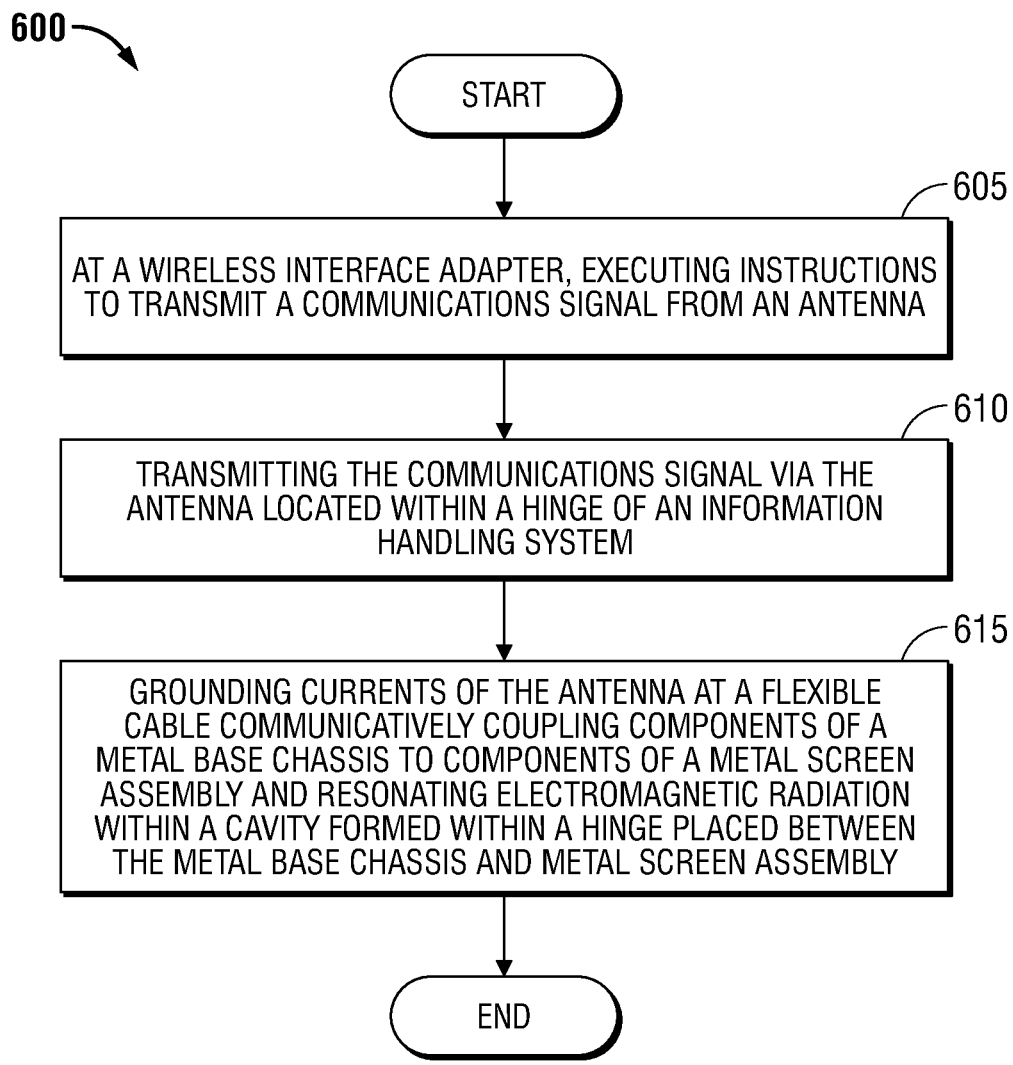
FIG. 6 is a flow diagram illustrating a method for operating an information handling system having an antenna cavity with a flex cable according to an embodiment of the present disclosure.

FIG. 6 is a flow diagram illustrating a method 600 for operating an information handling system having an antenna with a hinge gap resonant cavity according to an embodiment of the present disclosure. The method 600 may include, at block 605, executing instructions to transmit a communications signal from an antenna at a wireless interface adapter. In an embodiment, these instructions may be executed by the processor of the information handling system. In an embodiment, these instructions may be executed by an antenna adaption controller associated with the wireless interface adapter. In an embodiment, the execution of these instructions may be completed partially by the processor of the information handling system and antenna adaption controller. In either example, the execution of the instructions causes a voltage at a certain current or currents to be applied to an antenna such as a monopole antenna placed within an antenna cavity with an aperture vent. As described herein, the signals sent to the antenna may causes electromagnetic waves in any range of a radio frequency on the EM spectrum.

At block 610, the communications signal may be transmitted by the antenna. As described herein, the antenna may be placed within an antenna cavity formed within a hinge of the laptop information handling system or along a back of the D-cover under the C-cover of the information handling system along a hinge gap. A hinge gap resonant cavity may be bounded by the A-cover edge, the D-cover edge and may include a length bounded by a hinge edge coupling point and flex cable which determines the dimension of the hinge gap resonant cavity and prevents additional resonance along a hinge gap. In one example embodiment, the operation of the antenna may cause the hinge gap resonant cavity to resonate due to the current produced by the RF EM waves emitted by the antenna and/or its associated aperture. This resonance can be adjusted by grounding the flex cable at varying locations along the hinge gap. In an example the flex cable may include a grounding wire with a shielding layer that grounds the current produced by the emitted antenna RF EM waves so as to limit propagation of resonance down the hinge gap of the laptop information handling system. Consequently, the antenna may be moved from a location within the A-cover/B-cover in the drop hinge barrel assembly and to a location within the C-cover/D-cover assembly so as to provide for more space at the A-cover/B-cover assembly to house the video display device therein.

In the embodiments described herein, the placement of the flex cable also allows for the tuning of the antenna and hinge gap resonant cavity along the hinge gap. This tuning increases the coverage of the antenna by allowing the emitted RF EM signals from the antenna to resonate within the hinge gap resonant cavity while eliminating all other harmonics from being transmitted or received and propagated further along the hinge gap. Still further, the flex cable or other communication cable placed across the hinge gap may also, due to the grounding capability thereof, contain resonance of currents from propagating further along the hinge gap or elsewhere in the A-cover, barrel hinge, or base chassis so as to regulate the radiation path of the antenna systems described herein.

In an embodiment where the antenna and antenna cavity are placed within a drop hinge barrel of the A-cover, the antenna cavity may also include a barrel grounding wall that forms part of the A-cover in the drop hinge barrel. In the embodiments described herein, the antenna cavity includes a barrel grounding wall running and entire length of the antenna cavity within the drop barrel hinge in such embodiments. The barrel grounding wall may ground a current via the flex cable as described herein and ground that current between the A-cover and the D-cover in some embodiments.

At block 615, the method 600 may continue with grounding currents of the hinge gap between the A-cover and the D-cover via the flexible cable communicatively coupling components of a metal base chassis (i.e., the C-cover/D-cover assembly) to components of a metal display chassis assembly (i.e., the A-cover/B-cover assembly). By doing so, the flexible cable in some embodiments determines a length of the hinge gap resonant cavity from the hinge edge coupling point along the hinge gap providing for resonating electromagnetic radiation within the hinge gap resonant cavity between the metal base chassis and metal display chassis assembly. The resonance increases the coverage of the antenna at the target frequencies (i.e., 2.4 GHz or 5 GHz), thereby increasing the efficiency and efficacy of the antenna itself.

Figure 7:
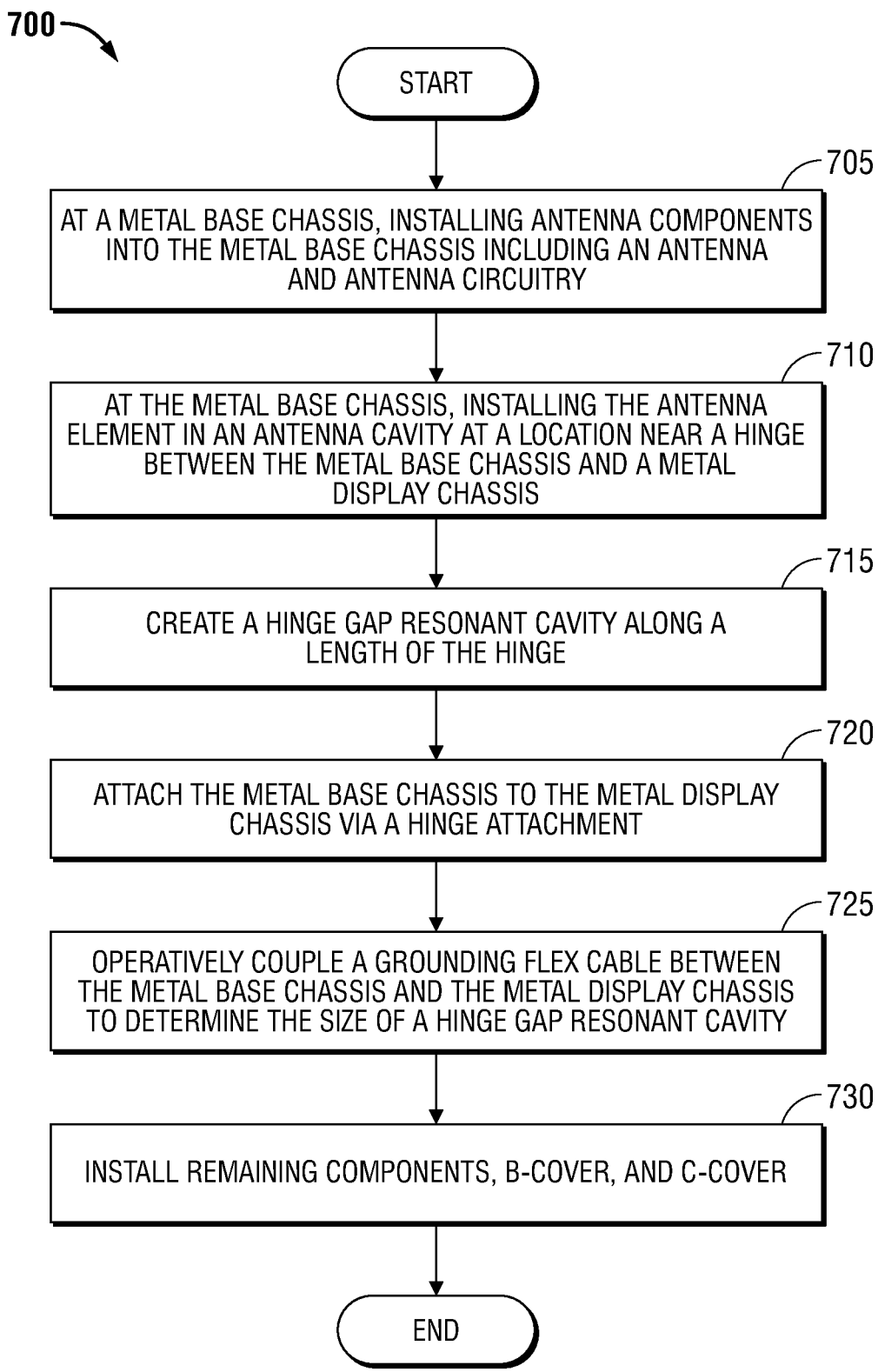
FIG. 7 is a flow diagram illustrating a method of assembling an information handling system according to an embodiment of the present disclosure.

FIG. 7 is a flow diagram illustrating a method 700 of assembling an information handling system according to an embodiment of the present disclosure. The processes described in connection with FIG. 7 that form the method 700 may be conducted in any order despite any order presented herein. The method 700 may start at block 705, with, at a base chassis, installing a number of antenna elements that may include an antenna and any antenna circuitry associated with the antenna. Examples of antenna circuitry include the wireless interface adapter that includes an antenna front end, an antenna adaption controller, and any radio frequency sub-systems that cause the antenna to operate as described herein.

The method 700 may, at block 710, continue with installing, within the metal base chassis, the antenna within an antenna cavity at a location along the back of the D-cover of the metal base chasses near where a hinge between the metal base chassis and a metal display chassis may be coupled. The metal base chassis may be similar to the D-cover described herein that includes a number of other devices including, for example, a processor, a battery, a keyboard, a touchpad, and a hard drive, among other components found in information handling systems and some of which are described with respect to FIG. 1. The antenna cavity will be covered with a C-cover fitted with the D-cover to form a C-cover/D-cover assembly that forms the base chassis. The antenna element and antenna cavity may lie below the C-cover in some embodiments. In one embodiment, the antenna element may be a monopole antenna, such as a planar wire antenna that may transmit wireless signals directly from the base chassis and antenna cavity containing the antenna element through a plastic antenna window or other structure such as from within a heat or audio vent. In another embodiment, the antenna cavity with the antenna element will have a slot aperture for transmission from the antenna cavity via capacitive coupling from the antenna element to the slot aperture. This antenna element transmission window or the slot aperture may be located along a back edge of the base chassis in the D-cover, in the C-cover along the back edge of the base chassis, or in a seam between the D-cover and C-cover. The antenna element or the aperture antenna may transmit from and receive RF signals to the antenna cavity.

The base metal chassis may be made of any metal that increases the aesthetics of the information handling system while still providing a resilient structure to hold the devices described herein. The metal display chassis may be similar to the A-cover described herein. The A-cover may serve as a back portion of a display device. Together, the metal base chassis and the metal display chassis may be coupled to each other via a hinge such as a drop hinge described herein.

The method 700 may continue at block 715 with creating a hinge gap resonant cavity along a length of the hinge. This hinge gap resonant cavity may be created by attaching, at block 720, the metal base chassis to the metal display chassis via a hinge attachment. Attachment of a variety of hinge types may be used as understood by those of skill and a hinge gap between the metal display chassis bottom edge and the metal base chassis back edge may therefore be formed according to various embodiments. In one embodiment, a drop barrel hinge of the A-cover of the metal display chassis may be attached at the sides to hinge edge coupling points formed of the D-cover of the metal base chassis. In this way, a length of hinge gap may be formed between the hinge edge coupling points along the drop hinge barrel of the A-cover and with the D-cover.

At block 725, operatively coupling a grounding flex cable between the metal base chassis and the metal display chassis may ground surface currents that are caused by resonance down the hinge gap. Selecting the location of the grounding flex cable across the hinge gap relative to a hinge edge coupling point may size the hinge gap resonant cavity formed in the hinge gap along the antenna aperture and antenna element or the planar wire antenna as described herein. Sizing of hinge gap resonant cavity is selected based on RF frequency bands and harmonics expected to be transmitted via the antenna elements of the respective embodiments.

As described herein, the flex cable may also be used to ground any excitation currents between the base metal chassis and the display metal chassis and contain the RF EM emissions to the hinge gap at the location of the antenna instead of along an entire length of the hinge thus forming the hinge gap resonant cavity. The hinge gap resonant cavity formed in the hinge gap may be contained by the flex cable, such as an FPC, by forming a ground path across the hinge gap to size the hinge gap resonant cavity transcieving wireless signals. A ground line or conductive outer layer on insulating sheath of the flex cable may form the ground path across the hinge gap between the display chassis and the base chassis. In an example embodiment, a conductive coating or conductive wrap may be applied to the outside of the insulating sheath and electrically coupled to the metallic A-cover, metallic D-cover, a heat sink or the like across the hinge gap. In the embodiment where multiple antennas are employed in the information handling system, this containment of the RF EM emissions at the individual antennas along the hinge gap to respective hinge gap resonant cavities for each antenna prevents cross-talk among the antennas thereby increasing the transmission and reception characteristics of the antennas. For example, two antenna elements and antenna apertures may be located along the back edge of the base chassis by the hinge gap. These antenna elements and antenna apertures may be located respectively at the back edge of the based chassis in an example embodiment near opposite hinge edge coupling points. Flex cables may be used to size hinge gap resonant cavities for each respective antenna element with its respective hinge edge coupling point. Thus, the placement of one or more flex cables along the surface of the hinge gap may allow for specific frequencies to be emitted by the antennas and resonate within the hinge gap resonant cavities described herein.

As described herein, in a specific embodiment, the antenna element or aperture antenna and hinge gap resonant cavity may be formed along the hinge gap near a metal heat sink along the back edge of a D-cover for the base chassis. The metal heat sink may resonate with the transmitted or received frequencies and may cause interference or reduced signal quality in some embodiments. Spanning the flex cable across the hinge gap between the metal base chassis and the metal display chassis before the metal heat sink location may reduce propagation down the hinge gap the metal heat sink and reduce resonance of the metal heat sink in some embodiments.

As described herein, in other embodiments, the hinge gap resonant cavity and antenna cavity may be formed by placing the antenna such as a planar wire antenna over the heat sink such that heat sink forms part of the resonating structures of the hinge gap resonant cavity. Locating the flex cable across the hinge gap may prevent further propagation down the hinge gap and be sized according to transmitting frequencies or harmonics to be transmitted or received by the antenna element of the present disclosures.

Proceeding to 730, any remaining components including power components, processing components, radio frequency components, input/output components, keyboard, touchpad, touchscreen, display, connector ports, cooling components, display components or the like may be installed in either the metal base chassis or the metal display chassis according to techniques understood by those of skill. Further, a C-cover may be installed with the D-cover to create a C-cover/D-cover assembly of the base chassis at 730. Additionally, the B-cover or any display cover may be installed with the metal A-cover to form a A-cover/B-cover assembly of a display chassis. Further, software and firmware installing, start up, and operational testing of a completed information handling system may be conducted.

Figure 8:
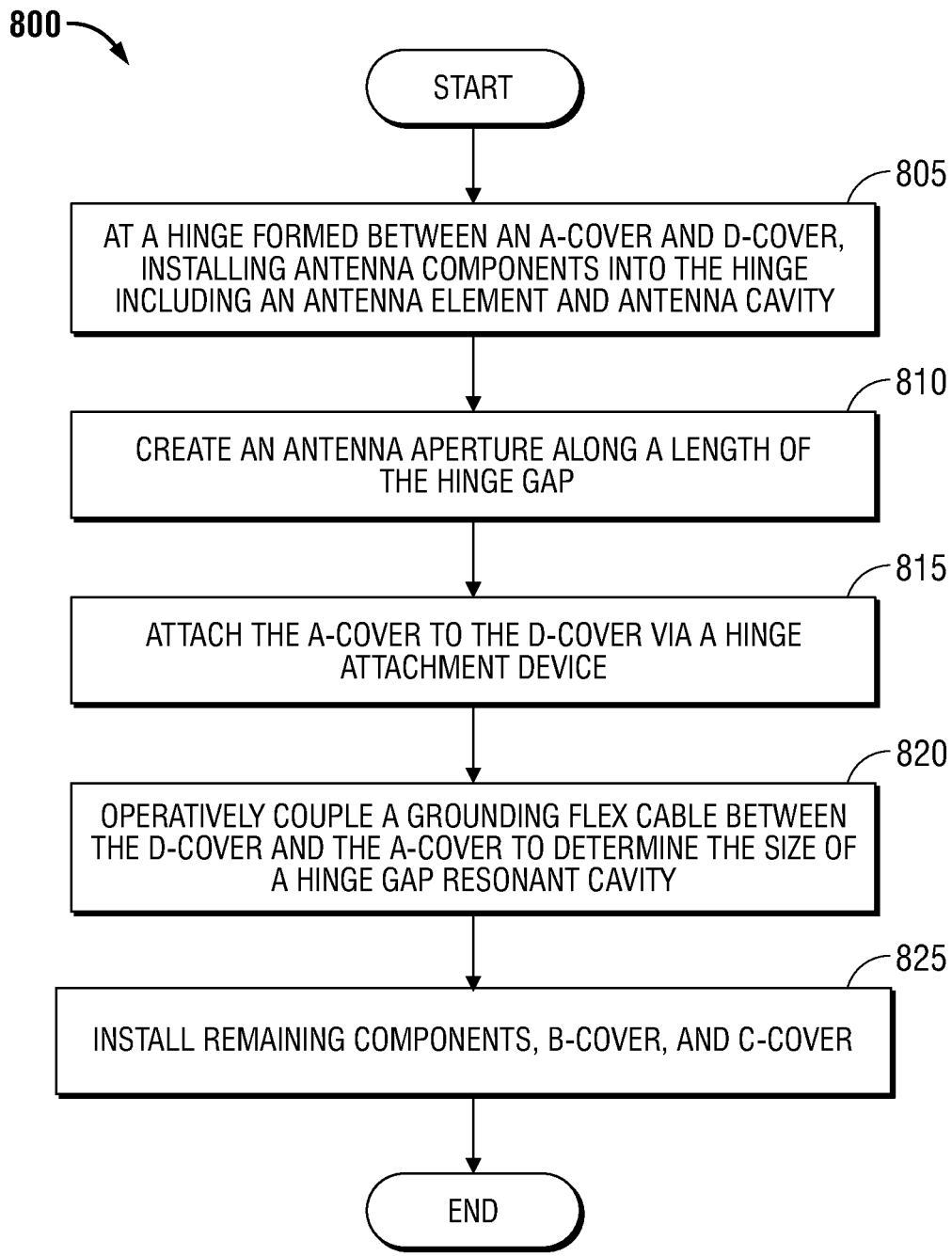
FIG. 8 is a flow diagram illustrating a method of assembling an information handling system according to an embodiment of the present disclosure.

FIG. 8 is a flow diagram illustrating a method 800 of assembling an information handling system according to an embodiment of the present disclosure. The processes described in connection with FIG. 8 that form the method 800 may be conducted in any order despite any order presented herein. The method 800 may start at block 805 with installing antenna components into a hinge formed between an A-cover and D-cover. The antenna components installed in the hinge may include an antenna element, an antenna cavity in the hinge, and an antenna aperture associated with the antenna element and antenna cavity. Antenna circuitry associated with the antenna element may be installed in the display chassis or may alternatively be installed in the base chassis to leave space in the display chassis to accommodate a display system with less bezel or no bezel. Antenna circuitry may include the wireless interface adapter that includes an antenna front end, an antenna adaption controller, and any radio frequency sub-systems that cause the antenna to operate as described herein. If located in the base chassis, the antenna circuitry may be operatively coupled the antenna element via flex cable as described or via other cabling such as through a hinge edge coupling point.

The method 800 may continue at block 810 with creating one or more antenna apertures along a length of the hinge. An antenna aperture may be created by forming the aperture in the hinge at a location that provides a radiofrequency outlet for the antenna cavity and the antenna element located in the hinge. The antenna aperture in the hinge is thus operatively coupled to the antenna installed within the hinge. In an embodiment, the antenna may excite an aperture such that RF EM waves propagate therefrom. The antenna may be a monopole antenna that excites the aperture by capacitive coupling to the aperture. The slot formed as the aperture may be operable at a half-wavelength of 2.4 GHz for examples and the monopole antenna may be operated at a quarter wavelength of 5 GHz. With this embodiment configuration, the excitation currents of the monopole antenna to excite the hinge gap thereby determining some or all of the cavity modes caused in the contained hinge gap resonant cavity between the drop hinge and D-cover. In an embodiment, the display FPC may provide additional ground to eliminate additional cavity modes not previously eliminated or determined by limiting or containing spread of resonance down the hinge gap or elsewhere in the base chassis or display chassis.

The method may continue at 815 with attaching the A-cover to the D-cover via a hinge attachment device. The attachment device may be any device or combinations of devices that secure the A-cover to the D-cover including pins and other coupling devices. In an example embodiment, a drop barrel hinge as a portion of the metal A-cover may be attached at hinge edge coupling points formed in the D-cover. Upon attachment of the hinge, a hinge gap is formed between the edge of the A-cover or drop barrel hinge portion of the A-cover and the back edge of the D-cover. This hinge gap may cause propagation of signals down the hinge gap from the antenna aperture and antenna element along the metal A-cover and metal D-cover.

To mitigate propagation down the hinge gap, the method 800 may also include, at block 820, operatively coupling a grounding flex cable between the D-cover and the A-cover to create the hinge gap resonant cavity. As described herein, the flex cable may be used to ground any excitation currents between the A-cover and D-cover and contain the RF EM emission resonance at the hinge gap location by the antenna element and antenna aperture instead of along an entire length of the hinge gap. The hinge gap resonant cavity formed in the hinge gap may be contained by the flexible cable, such as the FPC, by forming a ground path across the hinge gap to size the hinge gap resonant cavity transceiving wireless signals. A ground line or conductive outer layer on insulating sheath of the flex cable may form the ground path across the hinge gap between the display chassis and the base chassis. In an example embodiment, a conductive coating or conductive wrap may be applied to the outside of the insulating sheath and electrically coupled to the metallic A-cover, metallic D-cover, a heat sink or the like across the hinge gap.

Selecting the location of the flex cable relative to the hinge edge coupling point on the other side of the hinge gap from the antenna aperture and antenna element may determine the length of the hinge gap resonant cavity formed in the hinge gap. The size of the hinge gap resonant cavity may thus be determined by placement of the grounding portion of the flex cable across the hinge gap. The size of the hinge gap resonant cavity is selected to accommodate the expected operating frequencies and harmonics of the antenna element. In the embodiment where multiple antennas are employed in the information handling system, this containment of the RF EM emissions at the individual antennas prevents cross-talk among the antennas along the length of the hinge gap thereby increasing the transmission and reception characteristics of the antennas. For example, two antenna elements and antenna apertures may be located along the drop barrel hinge. These antenna elements and antenna apertures may be located respectively at the sides of the drop barrel hinge in an example embodiment near opposite hinge edge coupling points. Flex cables may be used to size hinge gap resonant cavities for each respective antenna element with its respective hinge edge coupling point. Thus, the placement of the flex cable along the hinge gap may allow for specific frequencies to be emitted by the antennas and resonate within the hinge gap resonant cavity described herein.

Proceeding to 825, any remaining components including power components, processing components, radio frequency components, input/output components, keyboard, touchpad, touchscreen, display, connector ports, cooling components, display components or the like may be installed in either the metal base chassis or the metal display chassis according to techniques understood by those of skill. A C-cover, including input/output devices such as keyboards, touchpads, or a display screen or touch screen may be installed with the D-cover to create a C-cover/D-cover assembly of the base chassis at 825. Additionally, the B-cover or any display cover may be installed with the metal A-cover to form a A-cover/B-cover assembly of a display chassis. Further, software and firmware installing, start up, and operational testing of a completed information handling system may be conducted.

The blocks of flow diagram of FIGS. 6, 7, and 8 discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system to wirelessly transmit and receive data at an antenna comprising:
    a base housing chassis containing components of the information handling system including a processor and memory and including a C-cover and a metal D-cover;
    a display chassis assembly having a display screen and including an A-cover;
    a hinge mechanically coupling the display chassis assembly to the base housing chassis;
    a hinge gap integrated along a hinge, where the hinge gap is between an edge of the A-cover and an edge of the metal D-cover;
    an antenna to emit a radio frequency signal to a contained hinge gap resonant cavity formed within the hinge gap; and
    a flexible printed circuit (FPC) operatively coupling the base housing chassis to the display chassis assembly to form a ground path across the hinge gap to shunt excitation currents along the hinge gap and to determine a size of the contained hinge gap resonant cavity between the A-cover and D-cover to accommodate an operating frequency of the radio frequency signal or harmonics of the operating frequency.

2. The information handling system of claim 1, wherein the FPC includes an insulating sheath to cover data lines and the sheath has a conductive outer layer to form the ground path.

3. The information handling system of claim 1, wherein the antenna is a planar wire antenna disposed in the base housing metal chassis along the hinge gap and under the C-cover.

4. The information handling system of claim 1, wherein the antenna element is an aperture antenna disposed in a metal hinge barrel of the A-cover forming the hinge such that the metal hinge barrel is moveable with rotation of the display chassis assembly with respect to the base housing metal chassis.

5. The information handling system of claim 1, wherein the contained hinge gap resonant cavity is sized to be operable at a half-wavelength of 2.4 GHz and the antenna element is sized to operate at a quarter wavelength of 5 GHz.

6. The information handling system of claim 1, wherein the FPC is one of a touch display FPC, an embedded display port (eDP) FPC, or a camera FPC.

7. The information handling system of claim 1, further comprising a second antenna placed along the hinge gap outside the contained hinge gap resonant cavity to emit a frequency different from the antenna.

8. The information handling system of claim 1, further comprising a heat sink placed within the hinge gap to reflect RF EM waves emitted by the antenna into the contained hinge gap resonant cavity.

9. A chassis assembly for an information handling system comprising:
    a base chassis assembly including a C-cover and a metal D-cover, the base chassis assembly housing components for an information handling system including a processor and a memory;
    a display chassis assembly including a metal A-cover and a B-cover;
    a flexible cable operatively coupling, via a ground path to shunt surface currents, between the base chassis assembly metal D-cover and the display chassis assembly metal A-cover;
    a hinge assembly including a hinge edge coupling point, operatively coupling the base chassis assembly to the display chassis assembly to form a hinge gap between the metal D-cover and the metal A-cover;
    the hinge assembly including an antenna element, an antenna cavity, and an antenna aperture integrated into the hinge assembly and the antenna element to emit a radio frequency signal; and
    wherein a ground path of the flexible cable is operatively coupled across the hinge gap relative to the hinge edge coupling point to determine a length to tune a contained hinge gap resonant cavity for an operating frequency of the radio frequency signal emitted by the antenna aperture.

10. The assembly of claim 9, wherein the hinge assembly is a metal drop barrel hinge formed along an edge of the metal A-cover and operatively coupled to the metal D-cover via a plurality of hinge edge coupling points.

11. The assembly of claim 9, wherein the antenna aperture is angled away from the display chassis assembly and radiates into the hinge gap resonant cavity formed between the hinge assembly and the base chassis assembly.

12. The assembly of claim 9, wherein the hinge gap resonant cavity formed between the hinge assembly and the base chassis assembly is formed by the flexible cable placed across the hinge gap to tune a length of the hinge gap resonant cavity to operate at a frequency of 2.4 GHz.

13. The assembly of claim 9, wherein the flexible cable is one of a touch display flexible cable, an embedded display port (eDP) flexible cable, or a camera flexible cable.

14. The assembly of claim 9 further comprising:
    a second antenna element disposed in the hinge assembly proximate to a second hinge edge coupling point; and
    a second flexible cable communicatively coupling base chassis assembly metal D-cover to display chassis assembly metal A-cover across the hinge gap to form a second hinge gap resonant cavity along the hinge gap for the second antenna element.

15. The assembly of claim 9, wherein the flexible cable includes an insulating sheath to protect data lines and the insulating sheath has a conductive layer to form the ground path.

16. An information handling system to transmit a communication signal comprising:
- a wireless interface adapter to selectively apply radiofrequency signal to an antenna element operatively coupled to an antenna aperture;
- a base chassis assembly containing components of the information handling system including a C-cover and a metal D-cover a processor, a memory, and the antenna element, wherein the antenna element is disposed along a back edge of the base chassis assembly along a hinge gap;
- a display chassis assembly including a display screen and a metal A-cover;
- a hinge mechanically coupling the base chassis assembly to the display chassis assembly and forming the hinge gap between the display chassis assembly and the base chassis assembly; and
- a flexible cable operatively coupling the metal A-cover to the metal D-cover to form a shunt of surface currents between the metal A-cover and the metal D-cover for a contained hinge gap resonant cavity to contain radiofrequency resonance occurring within the hinge gap.

17. The information handling system of claim 16, wherein the flexible cable is one of a touch display flexible cable, an embedded display port (eDP) flexible cable, or a camera flexible cable.

18. The information handling system of claim 16, wherein the contained hinge gap resonant cavity is sized by the flexible cable to be operable at a half-wavelength of 2.4 GHz and the antenna element is sized to operate at a quarter wavelength of 5 GHz.

19. The information handling system of claim 16, wherein the flexible cable is placed across the contained hinge gap resonant cavity relative to a hinge edge coupling point of the hinge to tune a length of the configurable cavity to operate at a frequency of 2.4 GHz.

20. The information handling system of claim 16 further comprising:
- a second antenna element disposed along the back edge of the base chassis assembly; and
- a second flexible cable operatively coupling the metal A-cover to the metal D-cover across the hinge gap to form a second contained hinge gap resonant cavity along the hinge gap for the second antenna element.

* * * * *